(12) United States Patent
Dieny et al.

(10) Patent No.: US 12,046,268 B2
(45) Date of Patent: Jul. 23, 2024

(54) CRYOGENIC MAGNETIC DEVICE MORE PARTICULARLY FOR LOGIC COMPONENT OR MEMORY

(71) Applicants: COMMISSARIAT A L'ENERGIE ATOMIQUE ET AUX ENERGIES ALTERNATIVES, Paris (FR); UNIVERSITE GRENOBLE ALPES, Saint Martin d'Heres (FR); INSTITUT NATIONAL POLYTECHNIQUE DE GRENOBLE, Grenoble (FR); CENTRE NATIONAL DE LA RECHERCHE SCIENTIFIQUE, Paris (FR)

(72) Inventors: Bernard Dieny, Grenoble (FR); Pedro Brandao Veiga, Grenoble (FR); Ricardo Sousa, Grenoble (FR); Liliana Buda-Prejbeanu, Grenoble (FR); Hélène Bea, Grenoble (FR); Cécile Grezes, Grenoble (FR)

(73) Assignees: COMMISSARIAT A L'ENERGIE ATOMIQUE ET AUX ENERGIES ALTERNATIVES, Paris (FR); UNIVERSITE GRENOBLE ALPES, Saint Martin d'Heres (FR); INSTITUT NATIONAL POLYTECHNIQUE DE GRENOBLE, Grenoble (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 207 days.

(21) Appl. No.: 17/669,809

(22) Filed: Feb. 11, 2022

(65) Prior Publication Data
US 2022/0262417 A1    Aug. 18, 2022

(30) Foreign Application Priority Data

Feb. 11, 2021 (FR) ........................................ 2101317

(51) Int. Cl.
*G11C 11/16* (2006.01)
*G11C 11/18* (2006.01)

(52) U.S. Cl.
CPC ........ *G11C 11/161* (2013.01); *G11C 11/1673* (2013.01); *G11C 11/1675* (2013.01); *G11C 11/18* (2013.01)

(58) Field of Classification Search
CPC .............. G11C 11/161; G11C 11/1673; G11C 11/1675; G11C 11/18
See application file for complete search history.

(56) References Cited

U.S. PATENT DOCUMENTS 10,818,329 B2 * 10/2020 Perrissin-Fabert ... G11C 11/161
11,120,856 B2 *  9/2021 Victora ................... H10B 61/00
(Continued)

OTHER PUBLICATIONS

Kawahara, T., "Challenges toward gigabit-scale spin-transfer torque random access memory and beyond for normally off, green information technology infrastructure (Invited)," Journal of Applied Physics 109, 07D325, (2011), 7 pages.
(Continued)

*Primary Examiner* — Mushfique Siddique
(74) *Attorney, Agent, or Firm* — Pillsbury Winthrop Shaw Pittman LLP

(57) ABSTRACT

A cryogenic magnetic device includes a free layer having a free magnetisation and a magnetic anisotropy favouring the orientation of the free magnetisation according to a first orientation or a second orientation, the magnetic anisotropy being defined by an energy barrier separating the first orientation and the second orientation, the amplitude of the energy barrier being less than 6300 $k_B$, the free layer having (Continued)

a Gilbert damping factor comprised between 0.02 and 0.4; a tunnel barrier extending in contact with the free layer; and a system configured to apply a voltage pulse through the tunnel barrier so as to reduce the amplitude of the energy barrier and switch the free magnetisation.

16 Claims, 14 Drawing Sheets

(56) References Cited

U.S. PATENT DOCUMENTS

| | | | | |
|---|---|---|---|---|
| 2006/0102969 | A1* | 5/2006 | Huai | H01F 10/3218 257/421 |
| 2015/0137289 | A1* | 5/2015 | Khalili Amiri | G11C 11/1659 257/421 |
| 2018/0033954 | A1* | 2/2018 | Aradhya | H01F 10/30 |
| 2019/0074044 | A1* | 3/2019 | Atulasimha | G11C 11/5607 |
| 2020/0185015 | A1* | 6/2020 | Le | G11C 11/1675 |

OTHER PUBLICATIONS

Yamamoto, T., et al., "Improvement of write error rate in voltage-driven magnetization switching," Journal of Applied Physics D:Applied Physics, vol. 52, (2019), 6 pages.

Search Report as issued in French Patent Application No. 2101317, dated Dec. 27, 2021.

Lang, L., et al., "A low temperature functioning CoFeB/MgO-based perpendicular magnetic tunnel junction for cryogenic nonvolatile random access memory," Applied Physics Letters, American Institute of Physics, vol. 116, No. 2, Jan. 2020, 6 pages.

Zhang, K., et al., "Compact Modeling and Analysis of Voltage-Gated Spin-Orbit Torque Magnetic Tunnel Junction," IEEE Access, IEEE, vol. 8, Mar. 2020, pp. 50792-50800.

Nozaki, T., et al., "Recent Progress in the Voltage-Controlled Magnetic Anisotropy Effect and the Challenges Faced in Developing Voltage-Torque MRAM," micromachines, vol. 10, No. 5, May 2019, 31 pages.

Grezes, C., et al., "Write Error Rate and Read Disturbance in Electric-Field-Controlled Magnetic Random-Access Memory," Spin Electronics, IEEE Magnetics Letters, vol. 7, (2016), 5 pages.

Rehm, L., et al., "Sub-nanosecond switching in a cryogenic spin-torque spin-valve memory element with a dilute permalloy free layer," Appl. Phys. Lett., vol. 114, (2019), 5 pages.

Rehm, L., et al., "Sub-nanosecond spin-torque switch ing of perpendicular magnetic tunnel junction nanopillars at cryogenic temperatures," Appl. Phys. Lett., vol. 115, (2019), 5 pages.

Rowlands, G. E., et al., "A cryogenic spin-torque memory element with precessional magnetization dynamics,"., Scientific Reports 9, 803, (2019), 7 pages.

Vernik, I. V., et al., "Magnetic Josephson junctions with superconducting interlayer for cryogenic memory," IEEE Trans. Appl. Supercond. 23, 1701208, (2013), 8 pages.

Teixeira, B. M. S., et al., "Ion irradiation-induced easy-cone anisotropy in double-MgO free layers for perpendicular magnetic tunnel junctions," Applied Physics Letters 112, 202403, (2018), 6 pages.

* cited by examiner

[Fig. 1a]
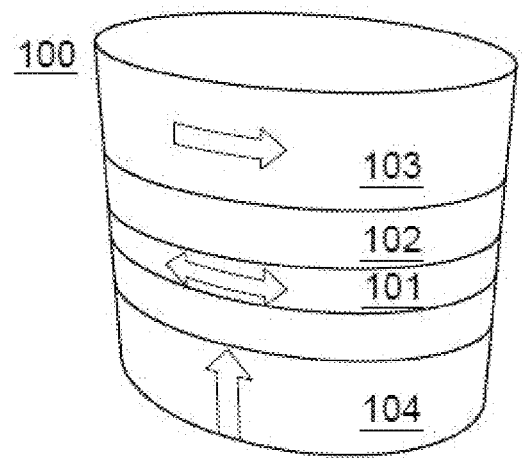
[Fig. 1b]
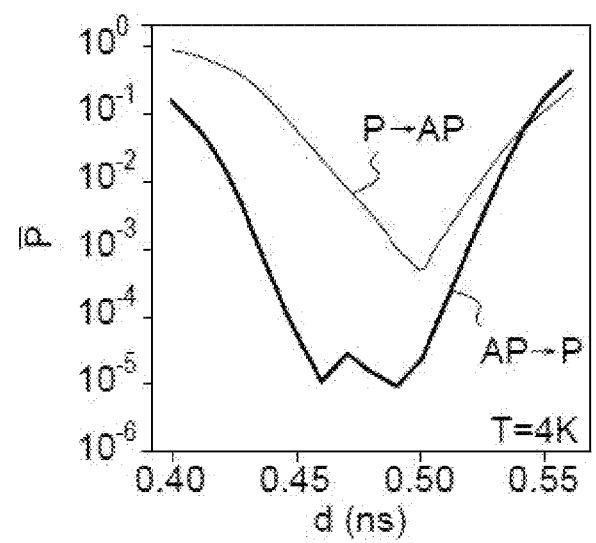

[Fig. 1c]
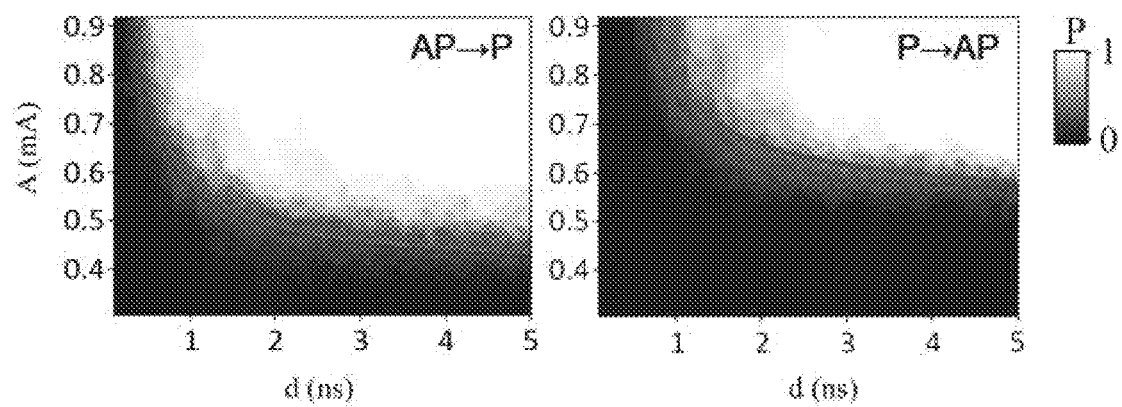
[Fig. 2a]
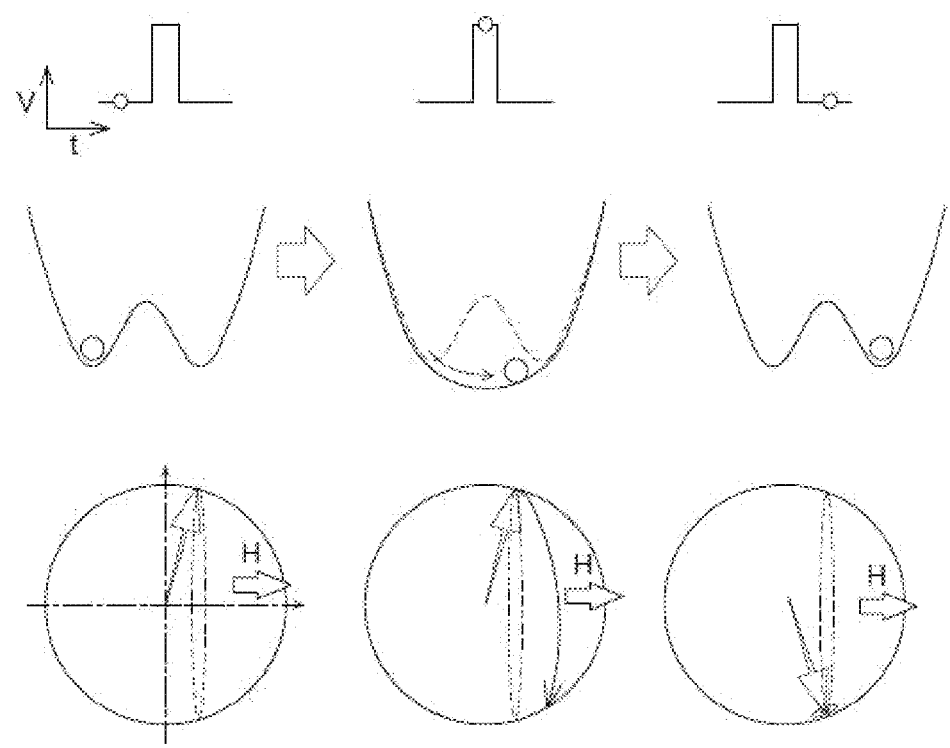

[Fig. 2b]
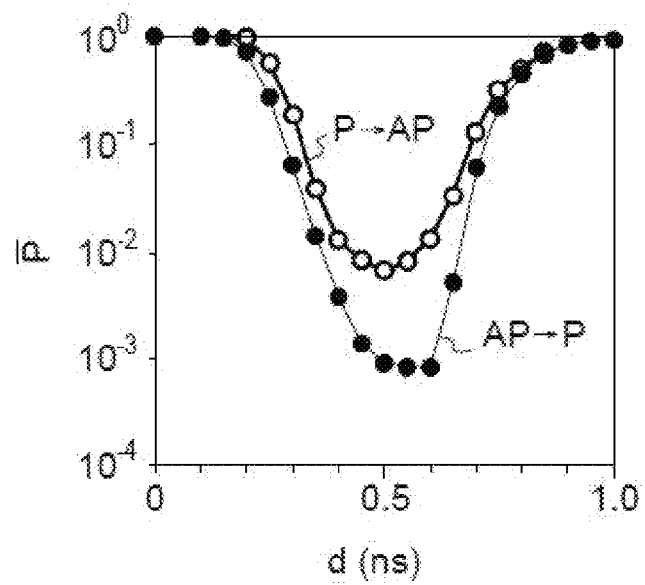
[Fig. 3]
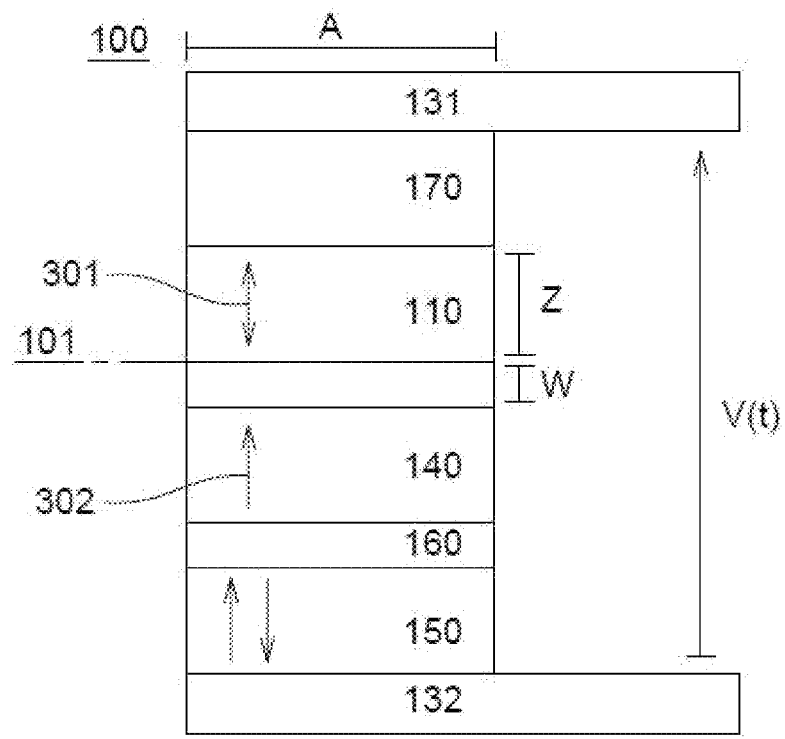

[Fig. 4a]
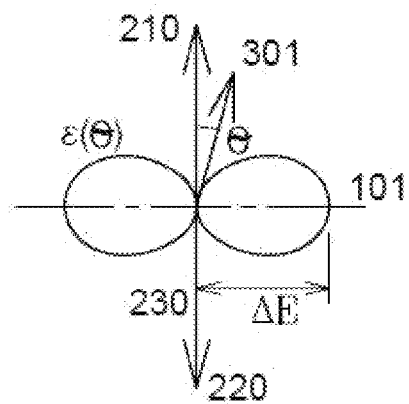
[Fig. 4b]
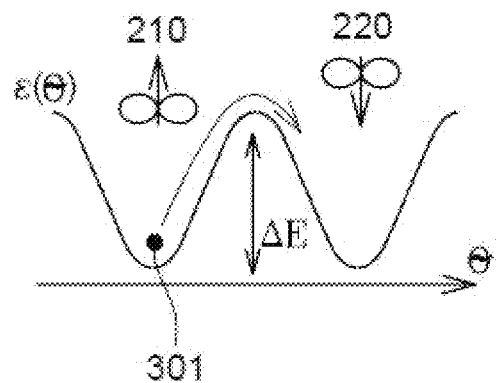
[Fig. 4c]
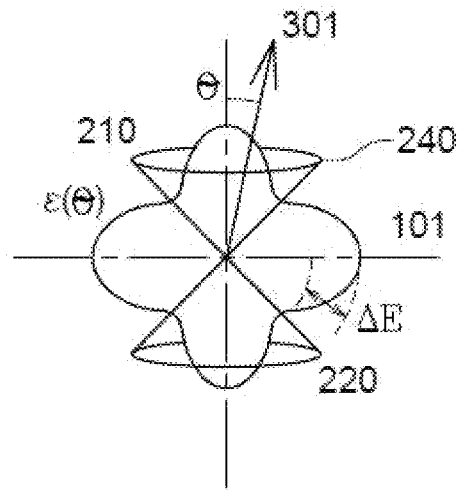

[Fig. 5]
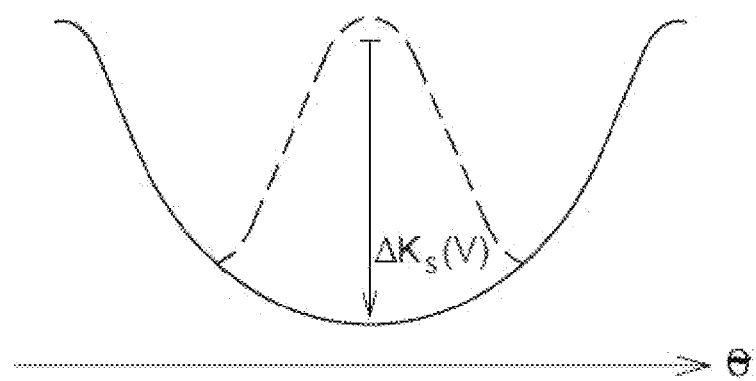
[Fig. 6]
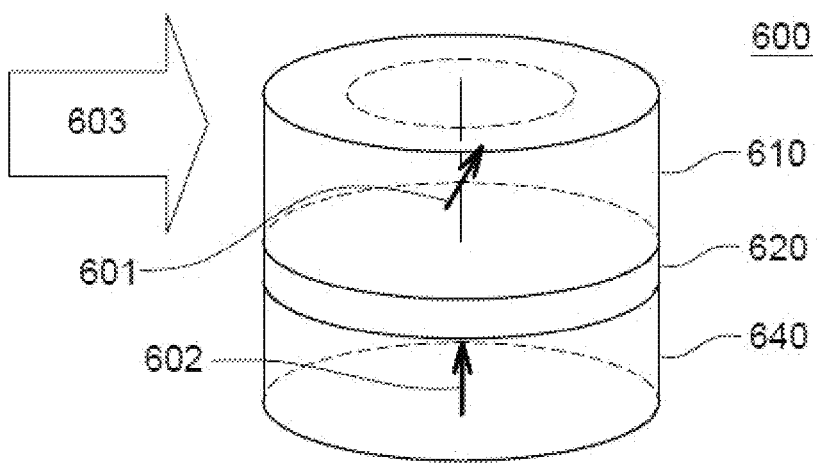

[Fig. 7]
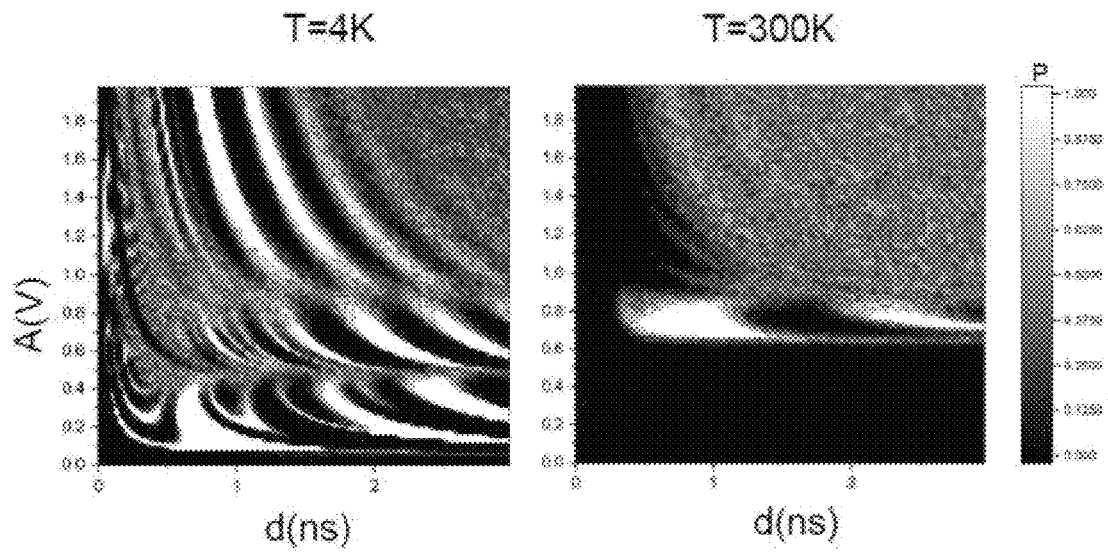
[Fig. 8]
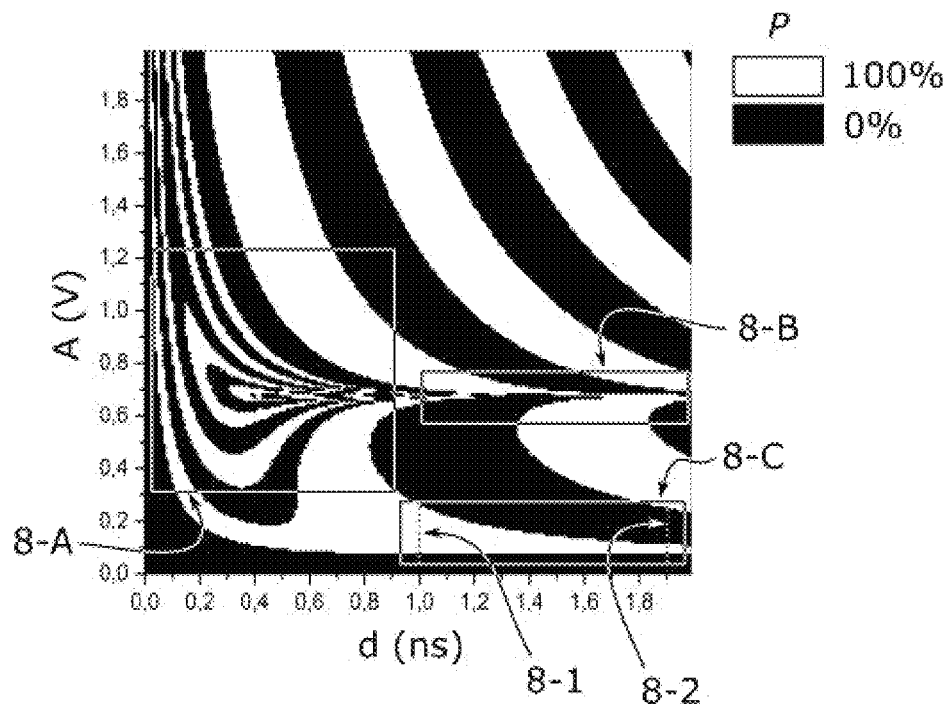

[Fig. 9]
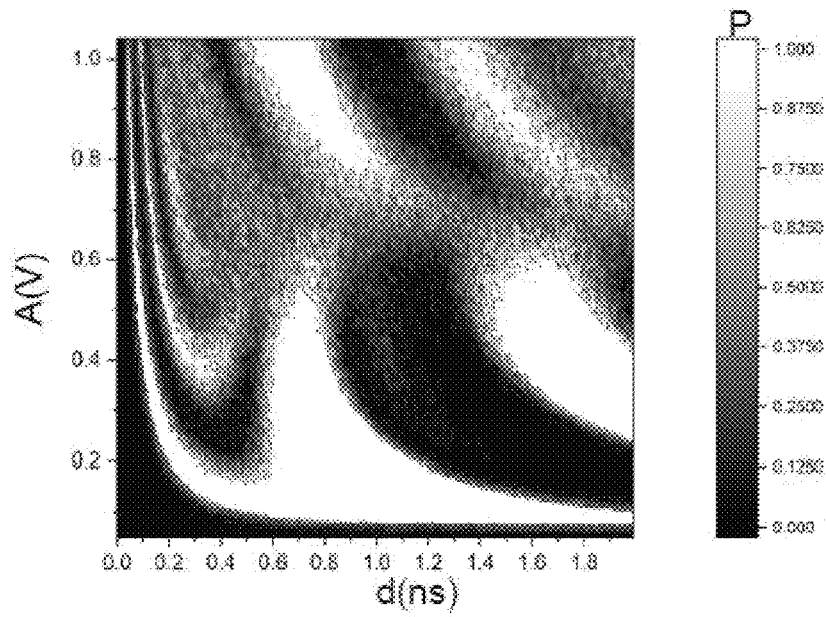
[Fig. 10]
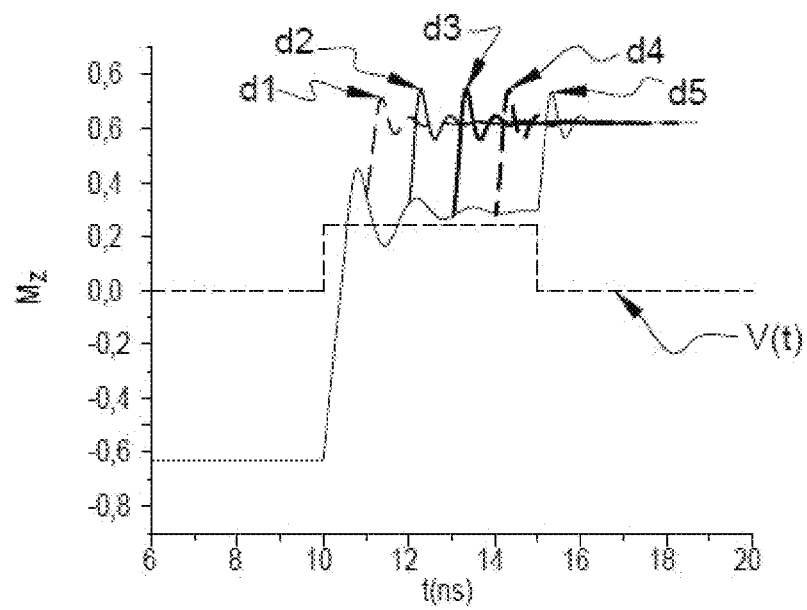

[Fig. 11a]
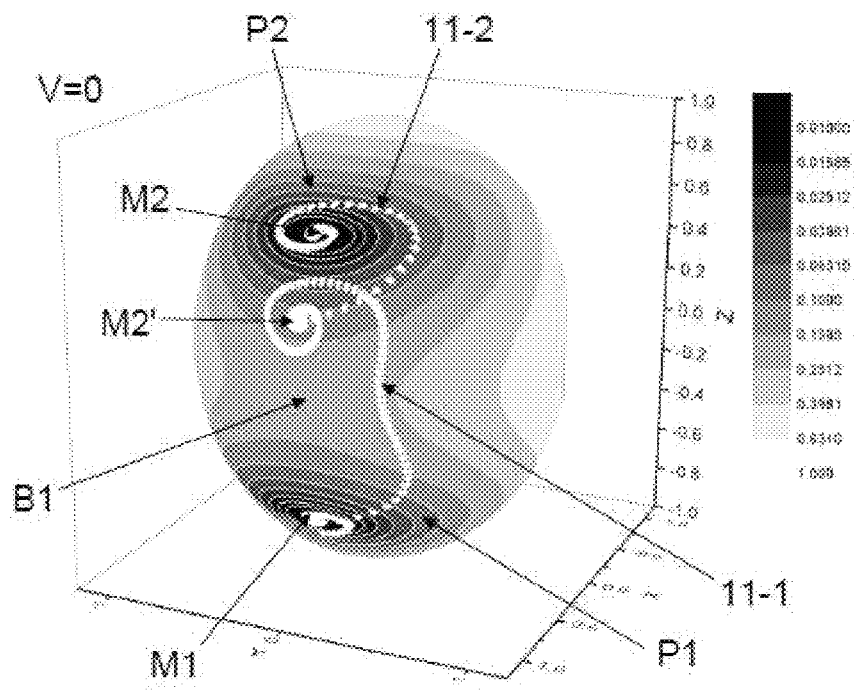
[Fig. 11b]
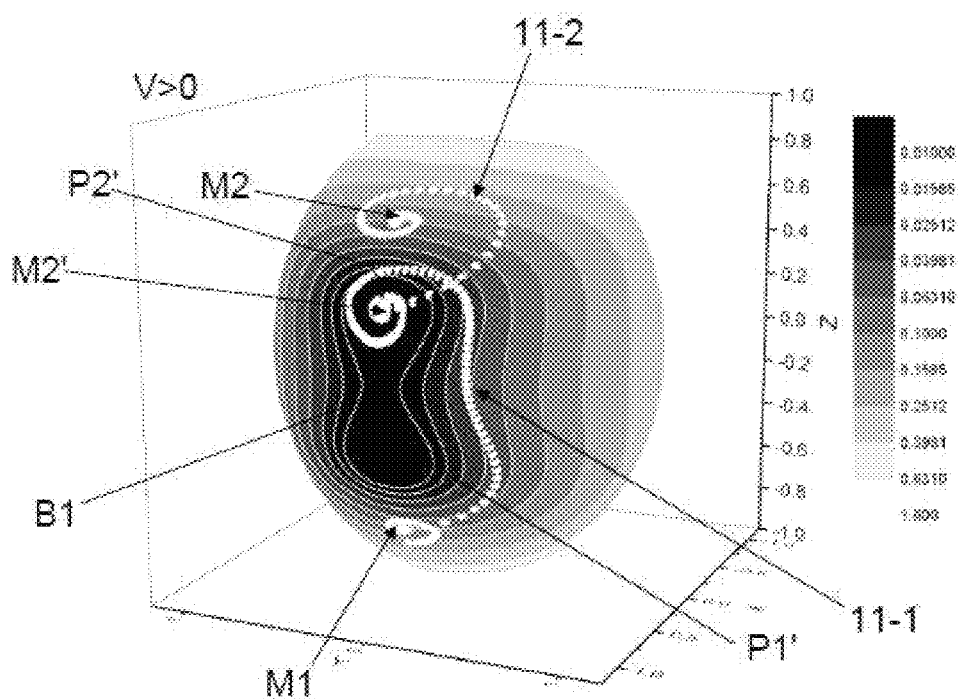

[Fig. 12]
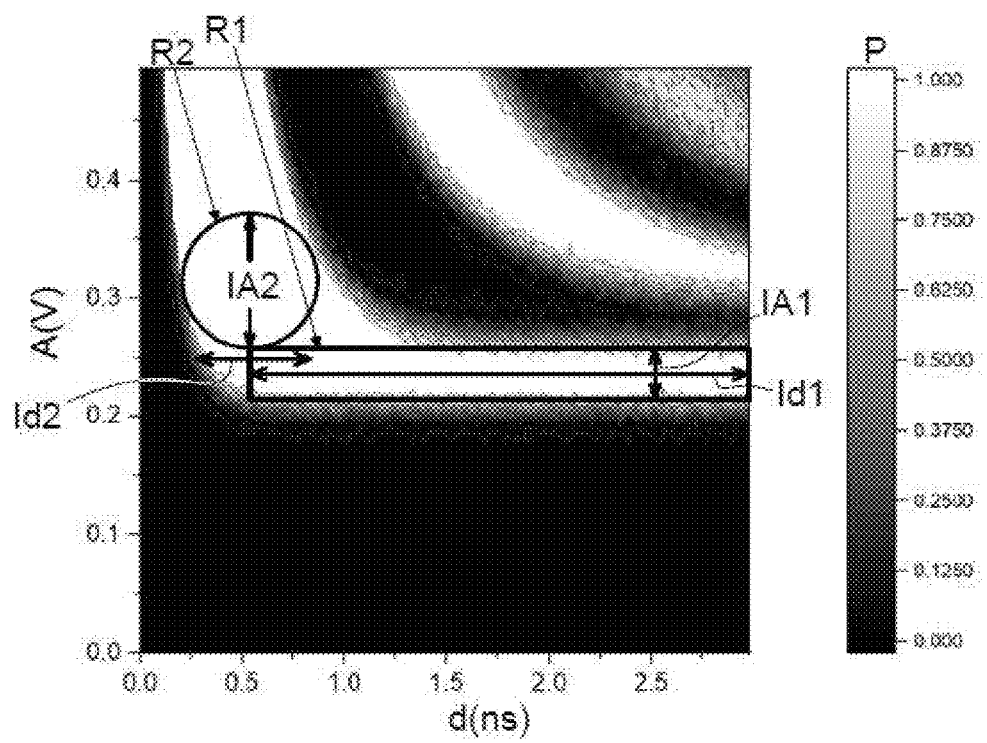
[Fig. 13a]
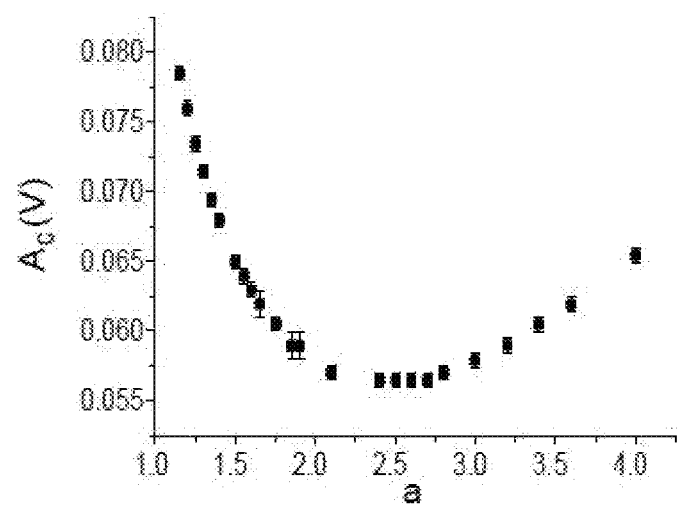

[Fig. 13b]
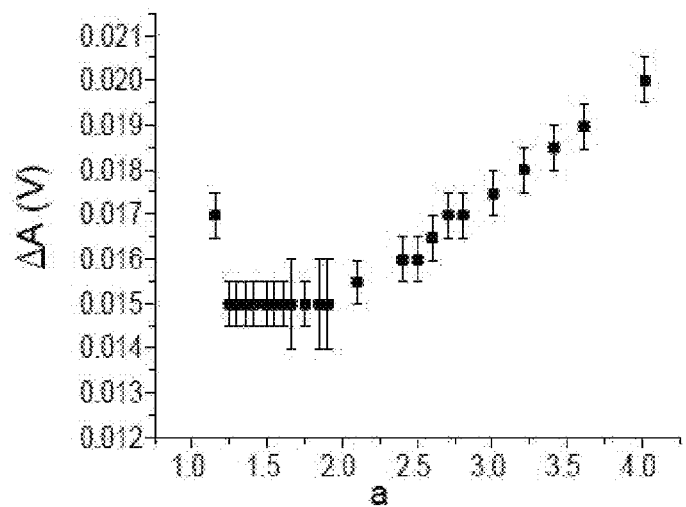
[Fig. 14a]
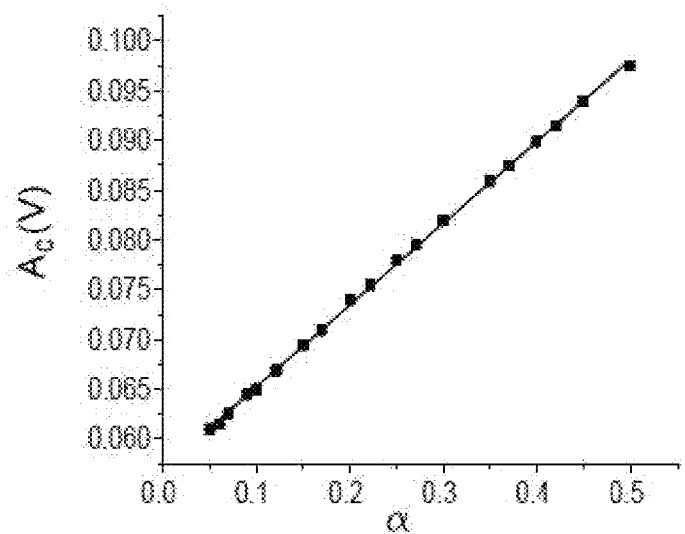

[Fig. 14b]
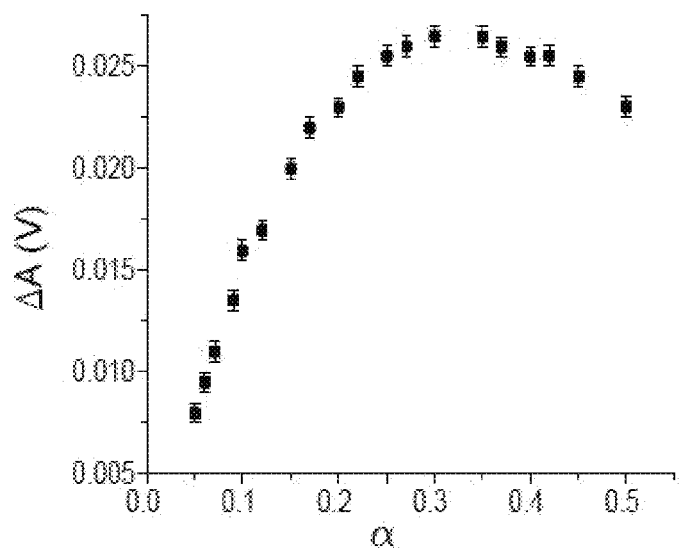
[Fig. 15a]
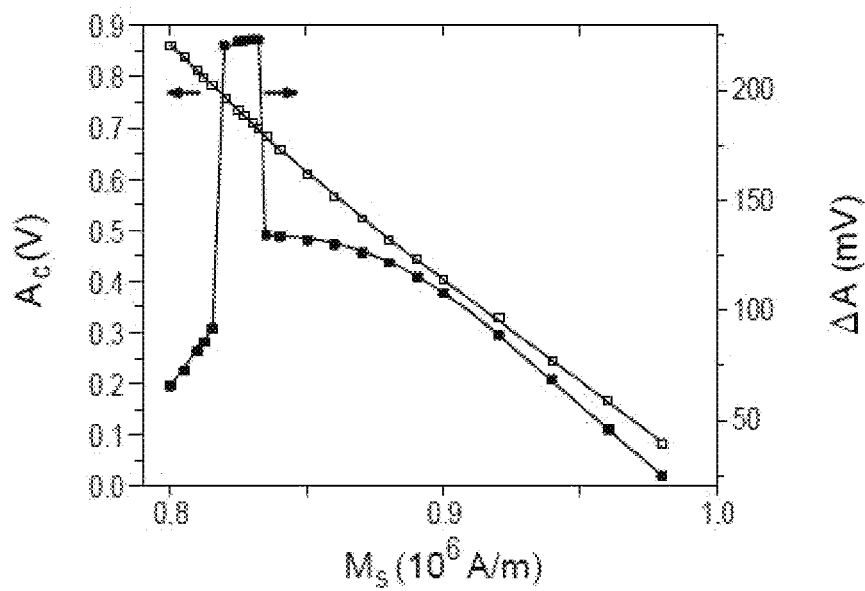

[Fig. 15b]
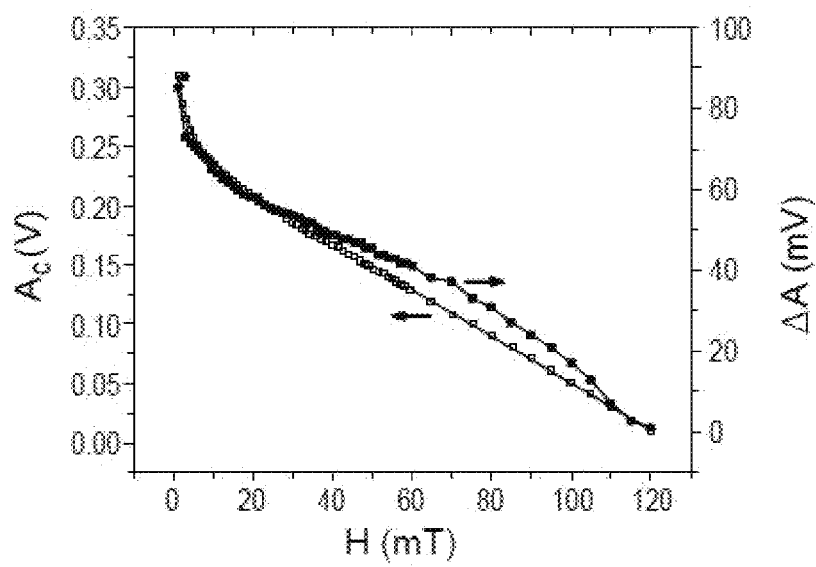
[Fig. 15c]
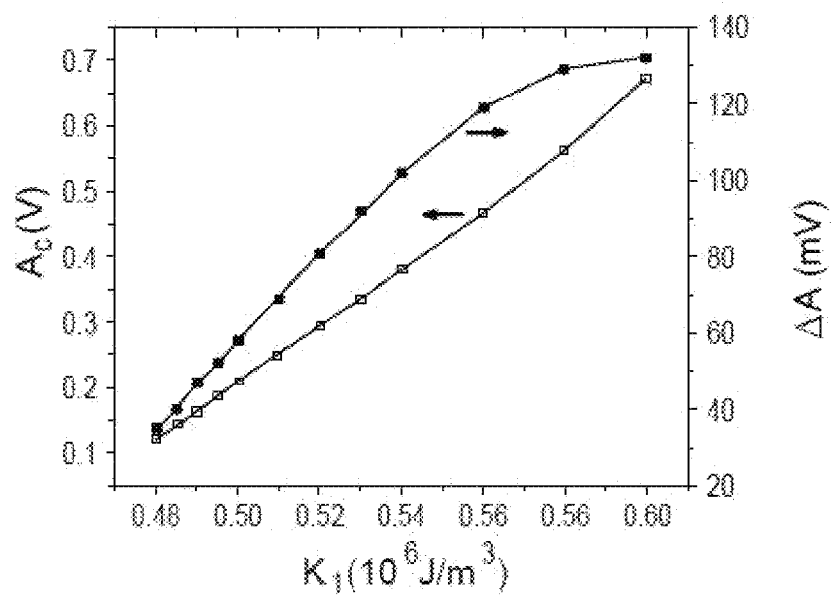

[Fig. 15d]
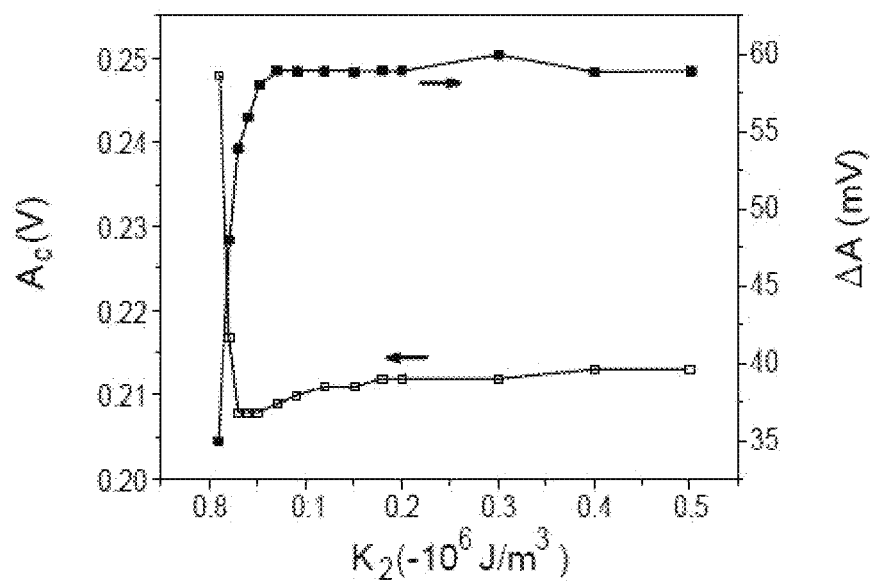
[Fig. 15e]
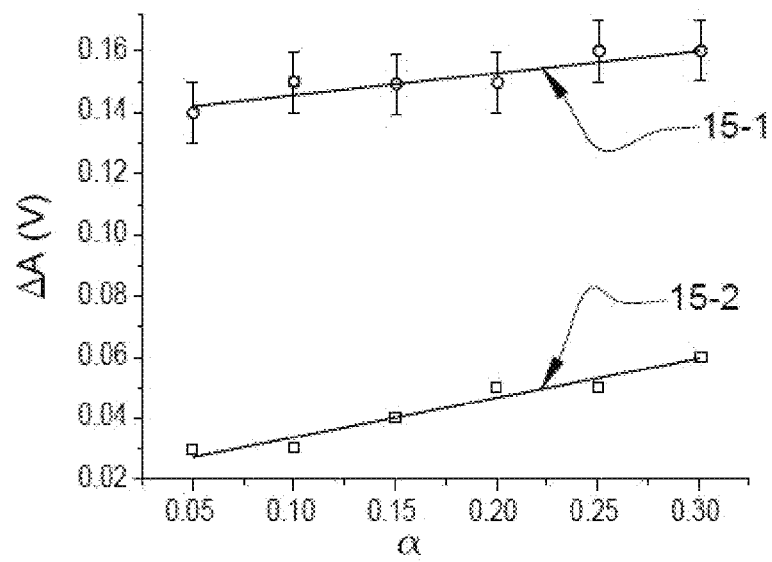

[Fig. 16]
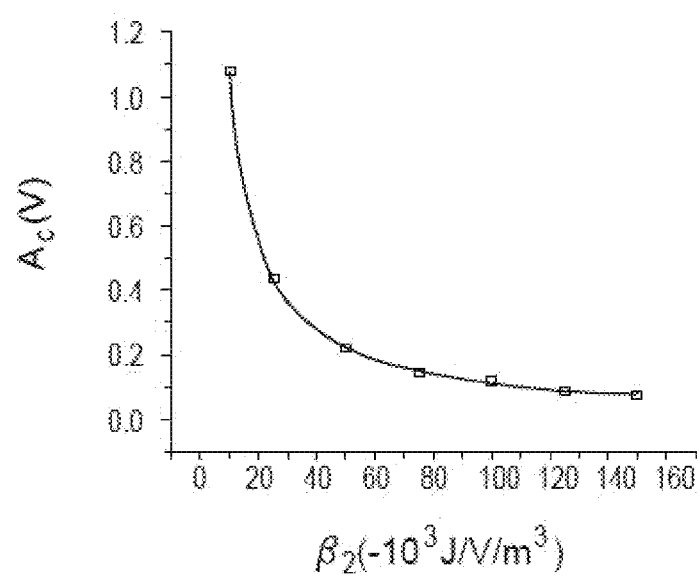

CRYOGENIC MAGNETIC DEVICE MORE PARTICULARLY FOR LOGIC COMPONENT OR MEMORY

CROSS-REFERENCE TO RELATED APPLICATIONS

This application claims priority to French Patent Application No. 2101317, filed Feb. 11, 2021, the entire content of which is incorporated herein by reference in its entirety.

FIELD

The technical field of the invention is that of magnetic devices intended to be implemented more particularly as a logic circuit or memory in a cryogenic environment. The present invention relates more particularly to the change in the magnetic state of a magnetic device implementing a voltage control of the magnetic anisotropy of said device.

BACKGROUND

In conventional digital electronics based on complementary metal/oxide/semiconductor (CMOS) technology, there is a large dissipation of static and dynamic energy. The first is mainly due to various current leakage when the transistors are in an open state, while the second is associated with the charging and discharging of the capacitive interconnections that connect the various components of the circuit. This increasing consumption of energy has stimulated a substantial worldwide effort to seek innovative solutions for increasing the global energy efficiency of electronic systems.

Recently, quantum technologies such as superconducting logic circuits with Josephson junctions have appeared as promising candidates for future computing architectures, benefiting from an enormous processing speed, low electrical consumption as well as fast interconnections and without loss between the circuit elements. In parallel, recent technical developments have made it possible to carry out large-scale cryogenic calculation infrastructures, where the energy savings realised by the calculation at cryogenic temperature exceeds the cost of the energy required to cool the system and maintain it at low temperature during operation. This passing to cryogenic calculation infrastructures requires adapting all the associated microelectronic components for operation at low temperature.

The emergence of quantum calculation technologies promises an increase in the calculation capacities. However, these technologies require recourse to a cryogenic environment in order to operate correctly. The transition from a calculation infrastructure that can operate at ambient temperature to a calculation infrastructure that requires a cryogenic environment thus involves adapting the associated elements, such as logic circuits or memories, to cryogenic conditions.

Non-volatile memories, in particular the magnetic memories of the MRAM ("Magnetic Random access memory") type, which retain their data in the absence of a power supply, are interesting because they make it possible to decrease the energy consumption by turning off the temporarily inactive portions of the circuit and therefore eliminating the leakage current in these portions. Recourse to a source of energy is then necessary only during read or write phases of a state in the non-volatile memory. The concept of electronic calculation in a normally-off circuit with instant-on ("Normally-Off/instant-On computing") was even introduced to describe this approach ("Challenges toward giga-bit-scale spin-transfer torque random access memory and beyond for normally off, green information technology infrastructure", Takayuki Kawahara, J. Appl. Phys. 109, 07D325, 2011).

Several proposals [Vernik, i. V. et al. "Magnetic Josephson junctions with superconducting interlayer for cryogenic memory", IEEE Trans. Appl. Supercond. 23, 1701208, 2013], based on a magnetic and superconducting hybrid tunnel junction, have been made in order to extend the field of application of magnetic memories of the MRAM type to the cryogenic environment. On the other hand these hybrid devices have large-scale deployment problems with respect to the magnetic memories comprising an entirely magnetic tunnel junction.

Several proposals for entirely magnetic memories, based on a magnetic tunnel junction or a spin valve, make use of the flow of a spin-polarised current within the magnetic memory in order to change the state of said magnetic memory.

A first proposal [G. E. Rowlands et al. "A cryogenic spin-torque memory element with precessional magnetization dynamics", Scientific Reports 9, 803, 2019] discloses a magnetic memory, shown in FIG. 1a, intended to be operated at a very low temperature (4 K) and comprising a spin valve. The magnetic memory 100 comprises a polarisation layer 104, having a magnetisation outside the plane of the layers, a free layer 101 having a variable magnetisation belonging to the plane of the layers, a reference layer 103 having a fixed magnetisation belonging to the plane of the layers and a non-magnetic metal layer 102 separating the free layer 101 and the reference layer 103. An pulse of electrical current, polarised by the polarisation layer 104, exerts a torque on the free layer 101, inducing a coherent precession movement of the magnetisation around the normal to the plane of the layers. The magnetisation reversion of the free layer 101, also called changeover, rollover or switching, is then obtained by a suitable adjustment of the duration of the current pulse. FIG. 1b shows an error rate in the magnetisation reversion $\overline{P}$ (also called write error rate) according to the duration d of the current pulse. The write is successfully carried out only in a very limited range of pulse conditions and with a rather high write error rate of about $10^{-3}$ Such a control of the duration of the pulses (duration of about 500 ps±30 ps) is very difficult to carry out on an electronic chip including a large number of magnetic devices due to the deformation of the current pulses when they propagate in the conductive lines connected to the magnetic devices. Furthermore, the optimum duration of the pulses is different for transitions from parallel (P, when the magnetisation of the reference and free layers are parallel) to antiparallel (AP, when the magnetisation of the reference and free layers are antiparallel) where 500 ps are required although, from antiparallel (AP) to parallel (P), 470 ps is sufficient, making the reversion all the more so difficult to control. In addition, this device is entirely comprised of metal layers, having a giant magnetoresistance perpendicular to the plane of the current which is only about 1%, too low to be used at the level of the chip.

A second proposal [L. Rehm et al. "Sub-nanosecond switching in a cryogenic spin-torque spin-valve memory element with a dilute permalloy free layer", Appl. Phys. Lett. 114, 212402, 2019] discloses a magnetic memory, also intended to be operated at very low temperature (3.2 K) and comprising a spin valve. On the other hand, in this example, the free layer comprises a permalloy alloy with copper (called diluted permalloy). The memory comprises a reference layer formed by a synthetic antiferromagnetic layer.

The reference layer has a thickness of 3 nm and comprises a CoFe alloy. The magnetisation of the reference layer belongs to the plane of the layers. The synthetic antiferromagnetic structure comprises the reference layer (CoFe), a spacer layer of 0.8 nm made from ruthenium and a second layer made from CoFe alloy. The memory also comprises a non-magnetic metal layer of 3.5 nm made from copper that separates the free layer from the reference layer. The magnetisation reversion of the free layer is carried out by a current pulse of about 0.7 mA for a duration of 2 ns. FIG. 1c shows on a grey scale the probability of magnetisation reversion according to the amplitude A and the duration d of the pulse. As the device is entirely metallic, the angular dependence of the spin transfer torque is very asymmetric, which induces a probability of reversion that is different according to the starting configurations: antiparallel (AP) and parallel (P). Furthermore, as in the preceding example, the magnetoresistance of the device is also here too low for practical applications.

A third proposition [L. Rehm et al. "Sub-nanosecond spin-torque switching of perpendicular magnetic tunnel junction nanopillars at cryogenic temperatures", Appl. Phys. Lett. 115, 182404, 2019] discloses a magnetic memory comprising a perpendicular magnetic tunnel junction (pMTJ), in order to overcome the problem of low magnetoresistance of the preceding approaches. Recall that a perpendicular magnetic tunnel junction comprises a free layer of which the magnetisation is oriented perpendicularly to the plane of the layers. The perpendicular magnetic tunnel junction further comprises a tunnel barrier with a magnesium oxide MgO base and has a tunnel magnetoresistance ratio of 203%. In addition, at very low temperature (4 K), the magnetisation reversion of the free layer is obtained thanks to a current pulse of 4 ns with an error rate of about $10^{-5}$. However, as shown in table 1 hereinbelow, the turnover energy E increases with the drop in temperature T to reach 286 fJ at 4 K which constitutes an electrical consumption that is incompatible with the integration of quantum technologies and large-scale cryogenic calculation infrastructures,

TABLE 1

| T (K) | TMR (%) | Ve (mV) AP→P | Ve (mV) P→AP | $\tau_0$ (ns) AP→P | $\tau_0$ (ns) P→AP | E (fJ) AP→P | E (fJ) P→AP |
|---|---|---|---|---|---|---|---|
| 4 | 200 | 399 | 421 | 0.94 | 1.03 | 103 | 286 |
| 75 | 193 | 393 | 416 | 0.94 | 1.05 | 98 | 283 |
| 150 | 182 | 381 | 403 | 0.96 | 1.10 | 94 | 287 |
| 295 | 117 | 225 | 305 | 1.48 | 1.38 | 51 | 195 |

Low energy consumption is a requirement that is necessary for minimising the cost of the cooling power and in order to obtain satisfactory thermal stability in light of the low thermal capacity of materials at low temperature.

A method for controlling the magnetic anisotropy via an electrical voltage, referred to as VCMA for "voltage-controlled magnetic anisotropy", is proposed [T. Nozaki et al. "Recent progress in the voltage-controlled magnetic anisotropy effect and the challenges faced in developing voltage-torque MRAM", Micromachines 10(5):327, 2019] as a new write mechanism for magnetic memories of the MRAM type at ambient temperature (of about 300 K). This method allows for a spectacular reduction in the write energy consumption, while still using combinations of materials conventionally used in the carrying out of magnetic tunnel junctions and that make it possible to obtain a high tunnel magnetoresistance ratio. The VCMA consists of a variation in the magnetic anisotropy that exists at the interface between a metal magnetic electrode, for example made of CoFeB, and a tunnel barrier, for example made of MgO, The variation in magnetic anisotropy is induced by the application of a polarisation voltage through the tunnel barrier. The anisotropy can be increased or decreased according to the polarity of the voltage applied. No current flow through the magnetic tunnel junction required to implement the VCMA. The power consumption required to return the magnetisation of a free layer is reduced with respect to the power consumption required to return the magnetisation of a magnetic memory requiring the flow of a current. In this latter case, the increase in power is in particular due to the ohmic dissipation via the Joule effect. The principle of the VCMA is shown in FIG. 2a. A magnetisation is represented by an arrow on a unit sphere and by a ball in an energy landscape representing the magnetic anisotropy. This energy landscape depends on the voltage V applied at the tunnel junction. When the ball is in a well of the energy landscape, the magnetisation is aligned according to a stable orientation. The wells of the energy landscape correspond to the stable orientations of the magnetisation in the real space in the absence of an applied voltage. In this case, the wells are separated by an energy barrier. The application of an electrical voltage at the terminals of the magnetic tunnel junction makes it possible, when it is correctly polarised, to modify the magnetic anisotropy, in particular lowering the energy barrier between the two wells, i.e. the barrier separating the two stable orientations of the magnetisation. This dynamically allows the ball to pass from one energy well to the other thus carrying out a switching of the magnetisation. During this switching, the magnetisation carries out a precession movement. This thus makes it possible to return the magnetisation by using a voltage pulse of which the polarity and the amplitude makes it possible to sufficiently lower the energy barrier. In addition, a pulse duration corresponding to about half of the precession period of the magnetisation is sufficient to carry out the reversion of the magnetisation.

[C. Grezes et al. "Write error rate and read disturbance in electric-field-controlled magnetic-random-access memory", IEEE Magn. Lett. 8, 2017] discloses an example of magnetisation reversion of a perpendicular magnetic tunnel junction configured to implement the VCMA. The perpendicular magnetic tunnel junction comprises in particular a magnetic metal electrode made from CoFeB and a tunnel barrier made from MgO. The magnetisation reversion is obtained at ambient temperature by VCMA thanks to a pulse of 500 ps and a total consumed energy of 6 fJ/bit. The energy consumed is clearly less than the energy consumed by a device controlled by spin transfer. [T. Yamamoto et al. "Improvement of write error rate in voltage-driven magnetization switching", J. Phys. D Appl. Phys. 52, 164001, 2019] discloses that the write error rate can be less than $10^{-6}$. However, the reversion via VCMA requires a control of the duration of the pulse of about a few tens of picoseconds, shown in FIG. 2b, a control that is difficult to carry out on an electronic chip.

Therefore, there exists a need to provide a magnetic device that makes it possible to store a piece of information that is in particular compatible with a cryogenic environment.

SUMMARY

An aspect of the invention makes it possible to reduce the energy consumption required in particular for the writing of a piece of binary information in a storage support. In addition, it makes it possible to offer a substantial effective retention time of the information that can be greater than about 10 years in operation at cryogenic temperature, which corresponds to the expectations in terms of non-volatility in the field of information storage. An aspect of the invention also makes it possible to reduce the constraint on the control of the duration of the electrical pulse required to carry out the writing of the binary information. For these reasons, an aspect of the invention provides a means for storing a piece of information that is compatible with a cryogenic environment.

An aspect of the invention relates to a voltage-controlled cryogenic magnetic device comprising:

a first magnetic layer, referred to as free layer, extending along a reference plane and having a first magnetisation, referred to as free magnetisation, and a magnetic anisotropy favouring the orientation of the free magnetisation according to a first orientation or a second orientation, the first orientation comprising a first component perpendicular to the reference plane and the second orientation comprising a second component perpendicular to the reference plane, the first perpendicular component and the second perpendicular component being of opposite signs, the magnetic anisotropy being defined by an energy barrier separating the first orientation and the second orientation, the amplitude of the energy barrier being less than 6300 $k_B$, the free layer having a Gilbert damping factor comprised between 0.02 and 0.4;

a second non-magnetic insulating layer, referred to as a tunnel barrier, extending in contact with the free layer; and a system configured to apply a voltage pulse through the tunnel barrier, said voltage pulse being suitable for reducing the amplitude of the energy barrier and switching the free magnetisation from:
the first orientation to the second orientation; or from the second orientation to the first orientation.

The term switching means the change in orientation of the free magnetisation passing from a stable orientation to another stable orientation. The terms switching, changeover, reversion or rollover will be used indifferently.

The term cryogenic device means a device suitable for use at a cryogenic temperature. Furthermore, the term cryogenic temperature means a temperature less than 150 K and more particularly a temperature less than or equal to the boiling temperature of nitrogen under standard conditions (about 77 K) or less than or equal to the boiling temperature of helium under standard conditions (about 4K).

$k_B$ is the Boltzmann constant.

Unless mentioned otherwise, the term "magnetisation" refers to the free magnetisation of the free layer.

The state of the cryogenic magnetic device corresponds to the orientation of the magnetisation of the free layer. For example when the magnetisation is aligned according to the first orientation, the state is "0" and when the magnetisation is aligned according to the second orientation, the state is "1". Thus, the cryogenic magnetic device offers a means of writing and of storing a binary piece of information or state.

The magnetic anisotropy defines an energy landscape wherein the magnetisation changes. The first and second orientations correspond to wells within this energy landscape separated by the energy barrier. The energy barrier makes it possible to reduce the probability that the magnetisation passes from one orientation to another, i.e. from one well to another. However, a barrier that has a high amplitude makes it more difficult to change the orientation of the magnetisation. It is thus necessary to provide a larger quantity of energy to proceed with the magnetisation reversion. Imposing a limited amplitude on the energy barrier makes it possible to limit the height of the energy barrier and therefore to ensure an easy reversion of the magnetisation. In this way, the quantity of energy required for the magnetisation reversion is reduced. The reduction in the height of the barrier is all the more so interesting in that the device is implemented within a cryogenic environment, the thermal activation therein being substantially reduced with respect to an environment at ambient temperature.

The amplitude of the energy barrier limited to 6300 $k_B$ makes it possible to obtain a retention duration of at least 10 years when the magnetic device is operated at a cryogenic temperature.

Writing a binary piece of information or state within the cryogenic magnetic device implements the controlling of the anisotropy by the voltage (referred to as VCMA for "Voltage Control of Magnetic Anisotropy"). According to the polarity of the electrical voltage pulse applied through the tunnel barrier, the energy landscape corresponding to the magnetic anisotropy is modified and the energy barrier can be increased or reduced. The modification of the energy landscape drives the magnetisation in a precession movement. When the polarity of the pulse is configured to reduce the amplitude of the energy barrier, then the precession movement can bring the magnetisation to exceed the energy barrier and thus change the well, i.e. carry out a switching.

Thus, thanks to the limited amplitude of the energy barrier, to the modulation of the amplitude of the energy barrier by a voltage pulse and to the precession movement that stems from it, the magnetisation is able to carry out a switching that requires only a reduced quantity of energy. The cryogenic magnetic device is therefore compatible with the requirements that a cryogenic environment imposes.

In addition to the characteristics that have just been mentioned in the preceding paragraphs, the cryogenic magnetic device according to the invention can have one or more additional characteristics among the following, taken individually or according to any technically permissible combination:

the Gilbert damping factor of the free layer is comprised between 0.05 and 0.3 and in an embodiment between 0.1 and 0.3;

the cryogenic magnetic device comprises a third magnetic and conductive layer, referred to as reference layer, extending in contact with the tunnel barrier and having a second magnetisation, referred to as reference magnetisation, fixed and substantially perpendicular to the reference plane;

the reference layer is able to transmit the voltage pulses to the tunnel barrier;

the free layer has a first thickness chosen so that the amplitude of the energy barrier is less than 6300 $k_B$;

the free layer has a magnetic anisotropy such that the first orientation and the second orientation belong to:
an easy axis, substantially perpendicular to the reference plane; or
an easy cone, the axis of the easy cone being substantially perpendicular to the reference plane;

the cryogenic magnetic device includes a system for applying a planar magnetic field at the free layer, at least during the duration of application of the voltage pulse, said planar magnetic field being substantially contained inside the reference plane;

the cryogenic magnetic device comprising an antiferromagnetic layer suitable for applying an exchange anisotropy at the free layer;

the free layer has an anisotropy comprising a uniaxial component substantially contained inside the reference plane;

the free layer has a crystallographic structure configured to induce the uniaxial anisotropy component substantially contained in the reference plane;

the free layer has the shape of an ellipse in the reference plane, the aspect ratio of the ellipse being in an embodiment comprised between 1.2 and 3;

the tunnel barrier is chosen such that the product of its resistance by its surface is greater than $10\Omega \cdot \mu m^2$ and in an embodiment greater than $100\Omega \cdot \mu m^2$.

the free layer comprises an Iron-based alloy, beneficially with an Iron and Cobalt base, and an amorphising element beneficially chosen from the following elements: Boron, Zirconium, Niobium, Hafnium or a combination of these amorphising elements. An amorphising element makes it possible to give an amorphous structure to the free layer during the deposition thereof;

the free layer comprises impurities that have a high spin-orbit coupling beneficially chosen from the following elements: Dysprosium, Terbium, Platinum, Palladium, Gold, Iridium, Tungsten, Tantalum or a combination of these elements;

the free layer comprises a first face, in contact with the tunnel barrier and a second face, opposite the first face, in contact with a dusting layer able to produce an increase in the Gilbert damping factor, this dusting layer comprising impurities that have a high spin-orbit coupling beneficially chosen from the following elements: Dysprosium, Terbium, Platinum, Palladium, Gold, Iridium, Tungsten, Tantalum or a combination of these elements;

the voltage pulse comprises:
  a first polarity configured to reduce the amplitude of the energy barrier, of a duration and amplitude chosen for switching the free magnetisation; and
  a second polarity opposite the first polarity and configured to increase the amplitude of the energy barrier, of a duration and amplitude chosen to allow for the reading of the magnetic state of the free layer.

The term "belongs to an easy cone" means belongs to the wall of said easy cone.

The invention and its various applications shall be better understood when reading the following description and when examining the accompanying figures.

BRIEF DESCRIPTION OF THE FIGURES

The figures are presented for the purposes of information and in no way limit the invention.

FIG. 1a diagrammatically shows a first magnetic memory according to the prior art.

FIG. 1b diagrammatically shows a switching error rate of a second magnetic memory according to the prior art.

FIG. 1c diagrammatically shows a probability of switching of a magnetisation from parallel to antiparallel state and from an antiparallel to parallel state of a third magnetic memory according to the prior art.

FIG. 2a diagrammatically shows a principle for controlling the magnetic anisotropy via an electrical voltage.

FIG. 2b diagrammatically shows a switching error rate of a fourth magnetic memory according to the prior art.

FIG. 3 diagrammatically shows an embodiment of a cryogenic magnetic device according to the invention.

FIG. 4a diagrammatically shows a first example of magnetic anisotropy of the cryogenic magnetic device according to the invention.

FIG. 4b diagrammatically shows a second example of magnetic anisotropy of the cryogenic magnetic device according to the invention.

FIG. 4c diagrammatically shows a third example of magnetic anisotropy of the cryogenic magnetic device according to the invention.

FIG. 5 diagrammatically shows an effect of the application of an electrical voltage through the cryogenic magnetic device according to the invention.

FIG. 6 diagrammatically shows a digital model that corresponds to the cryogenic magnetic device according to the invention.

FIG. 7, FIG. 8, FIG. 9, FIG. 10 show first results of the digital simulation of the digital model of FIG. 6.

FIG. 11a and FIG. 11b diagrammatically show first and second trajectories sequentially followed by the magnetisation of the digital model of FIG. 6 during the switching implementing the controlling of the magnetic anisotropy via an electrical voltage.

FIG. 12, FIG. 13a, FIG. 13b, FIG. 14a, FIG. 14b, FIG. 15a, FIG. 15b,

FIG. 15c, FIG. 15d, FIG. 15e and FIG. 16 show second results of the digital simulation of the digital model of FIG. 6.

Unless mentioned otherwise, the same element appearing on different figures has a unique reference. The figures are presented for the purposes of information and in no way limit the invention.

DETAILED DESCRIPTION

FIG. 3 shows a diagrammatical representation of an embodiment of a cryogenic magnetic device 100 according to the invention. The device 100 can form a magnetic memory of the MRAM type comprising a magnetic tunnel junction.

The device 100 comprises a first magnetic layer 110, referred to as free layer, extending along a reference plane 101 that shall also be referred to as plane of layers. The free layer 110 has a magnetic anisotropy ε and a first magnetisation 301 that shall be referred to as free magnetisation.

A second non-magnetic insulating layer 120, referred to as a tunnel barrier, extends in contact with the free layer 110.

A third magnetic layer 140, referred to as reference layer, extends in contact with the tunnel barrier 120. The reference layer 140 has a second magnetisation 302 that shall also be called reference magnetisation, frozen substantially perpendicularly to the reference plane 101.

A fourth antiferromagnetic layer 150 or called synthetic antiferromagnetic is magnetically coupled with the reference layer 140, making it possible to freeze the reference magnetisation 302.

A system 131, 132 configured to apply an electrical voltage V(t) through the tunnel barrier 120. The system can include a voltage source or generator. The system 131, 132 comprises two portions 131, 132 in contact with the stack comprising the four aforementioned layers allows for the application of the voltage V(t) on the stack and more particularly at the terminals of the tunnel barrier 120, i.e. through the tunnel barrier 120. The term "through the tunnel barrier" means in the thickness of the tunnel barrier 120. The system can include conductive electrodes, for example made from Copper Cu. The system 131, 132 can also include the free layer 110 and the reference layer 140. For this, the free 110 and reference 140 layers are in an embodiment conductive so as to allow for the transmission of the electrical voltage V(t) on the tunnel barrier 120.

The free layer 110 can be carried out from an alloy comprising Iron and beneficially a Cobalt and Iron alloy, such as the CoFe or CoFeB alloy.

The free layer can also include amorphising elements. Amorphising elements are known to those skilled in the field for giving an amorphous structure during the deposition of the free layer 110 and allowing for a recrystallisation according to a body-centred cubic during an annealing after the deposition. The body-centred cubic, called BCC, makes it possible to obtain a high tunnel magnetoresistance amplitude when the free layer 110 is combined with a tunnel barrier 120 with a MgO base. The amorphising elements are beneficially chosen from: boron B, zirconium Zr, niobium Nb and hafnium Hf or a combination of these elements. The amorphising elements can beneficially be chosen from all the elements or combination of elements that have the aforementioned benefits.

The free layer 110 can also include magnetic elements such as nickel Ni or non-magnetic elements such as carbon C.

When the device 100 is operated at cryogenic temperature, in particular less than 20 K, then the free layer 110 can beneficially comprise materials that have a low Curie temperature, for example less than 473 K (200° C.). Materials that have a Curie temperature less than the ambient temperature can also be considered. This can for example be a Heusler alloy such as $Co_2MnSi$, $Co_2Mn_{1.29}Al$, $Co_2FeAl_{0.5}Si_{0.5}$, $Co_2FeAl$, $Co_2Cr_{0.6}Fe_{0.4}Al$ or $Co_2Fe_{0.4}Mn_{0.6}Si$. These materials make it possible to obtain a high amplitude of the tunnel magnetoresistance signal. For example, $Co_2MnSi$ allow makes it possible to obtain a magnetoresistance signal of about 1995% at 4.2 K.

The tunnel barrier 120, can be carried out from oxide, nitride or from a combination of oxides and nitrides. For example, this can be MgO, $MgAl_xO_y$, $AlO_x$, $TiO_x$, $HfO_x$, $TaO_x$, AlN, BN or TiN.

The reference layer 140 can be carried out from the same materials as the free layer 110, such as CoFeB. The reference layer 140 can beneficially have a thickness comprised between 1 nm and 1.4 nm. In addition to the aforementioned elements, the reference layer 140 can also comprise, in the same way as the free layer 110, magnetic elements such as Ni, non-magnetic elements such as C, rare earths or amorphising elements. The fourth antiferromagnetic layer 150 comprises in an embodiment two ferromagnetic sublayers separated by a spacer sublayer, the two ferromagnetic sublayers being coupled in such a way that their respective magnetisations are aligned in an antiparallel manner through the spacer sublayer. This is in the case referred to as synthetic antiferromagnetic layer or SAF layer. The two ferromagnetic sublayers in an embodiment comprise Co, Pt, Ni or multilayers that comprise these elements, such as: $Co_x/Pt_y$, $Co_x/Pd_y$, or $Co_x/Ni_y$. The magnetic coupling between the two ferromagnetic sublayers, which can be an exchange coupling such as the Ruderman-Kittel-Kasuya-Yoshida coupling referred to as "RKKY", directly depends on the nature of the spacer sublayer, for example made of Ruthenium Ru, and on its thickness, that will in an embodiment be chosen between 0.4 nm and 0.9 nm in the case of Ruthenium.

The SAF layer 150, coupled with the reference layer 140, reinforces the magnetic anisotropy of the latter, making it possible to freeze the direction of the reference magnetisation outside the reference plane 101.

The crystalline structures of the SAF layer 150, for example face-centred cubic, and of the reference layer 140, for example centred cubic, can be adapted to one another by means of a fifth metal and non-magnetic layer 160 called structural transition layer. The structural transition layer 160 is characterised by its thickness, comprised between 0.2 nm and 0.4 nm, and its composition, beneficially comprising Tantalum Ta, Tungsten W or Molybdenum Mo. The transition layer 160 also makes it possible to absorb the amorphising elements coming from the reference layer 140 during the post-deposition annealing of the device 100.

The respective thicknesses of the reference layer 140, of the SAF layer 150 and of the transition layer 160, are in an embodiment configured according to the magnetisation of the various magnetic layers 140 and SAF 150, in order to limit their leakage fields at the free layer 110. Thus, the relative orientation of the free magnetisations in relation to the reference magnetisation, whether it be parallel or antiparallel, is not favoured in one direction or the other by said leakage fields.

The device 100 beneficially comprises a buffer layer, not shown in FIG. 3, allowing for good growth of the various layers, i.e. with an effective roughness, beneficially less than 0.4 nm and a good texture. The buffer layer can comprise Platinum Pt and have a thickness of 3 nm. The device 100 can also include a wetting layer, not shown in FIG. 3, comprising Tantalum Ta and having a thickness of about 3 to 6 nm. This wetting layer is used for example to favour the adherence of the deposition on an oxide substrate.

A first example of magnetic anisotropy ε of the magnetic device is shown in FIG. 4a. It corresponds to a magnetic anisotropy ε wherein a first-order anisotropy term, also called uniaxial anisotropy term, is dominant. It is thus expressed according to the relationship $$\varepsilon(\theta) = K_1 \sin^2(\theta)$$ [Math. 1]

where $K_1 > 0$ is the first-order anisotropy coefficient and θ is the angle between the free magnetisation 301 and the normal to the reference plane 101. The anisotropy ε is maximal when the magnetisation 301 is in the reference plane 101 and minimal when the magnetisation 301 is perpendicular to the reference plane 101. The orientation towards which the magnetisation 301, in the absence of an external field, tends to orient forms an axis 230 perpendicular to the reference plane 101, that is called easy axis.

The easy axis 230 induces a first orientation 210 stable and a second orientation 220 stable towards which the free magnetisation tends to orient 301. The first orientation 210 corresponds to a first direction along the easy axis 230 and the second orientation 220 correspond to a second direction, opposite the first direction, along the easy axis 230. In other words, the first orientation 210 and the second orientation 220 each include a component perpendicular to the reference plane 101, their respective perpendicular components being of opposite signs. The two orientations 210, 220 correspond to the "high" or "low" states, or the "0" or "1" states, of the magnetic device. The switching of the device is therefore having the free magnetisation pass from the first orientation 210 to the second orientation 220 or vice-versa.

The first and second orientations 210, 220 are separated by an energy barrier ΔE, that shall also be called potential barrier or anisotropy barrier, reducing the probability that the free magnetisation 301 passes uncontrollably from the first orientation 210 to the second orientation 220 and vice-versa.

Higher-order anisotropy terms, for example of magnetocrystalline origin, can appear in the expression of the anisotropy ε, modifying the shape of the total anisotropy. For example, an interface anisotropy between the free layer and the tunnel barrier can comprise higher-order anisotropy terms that are added to the anisotropy of the free layer. The roughness, the variations in composition or the variations in thickness of the free layer can also induce higher-order anisotropy terms.

FIG. 4a diagrammatically shows the magnetic anisotropy ε(θ) of the free layer according to the angle θ. The magnetic anisotropy ε(θ) corresponds to an energy landscape wherein the free magnetisation 301, represented by a ball, is displaced. The stable orientations 210, 220 each correspond to a well of the energy landscape. An anisotropy barrier of height ΔE separates these two wells.

The free layer has a thermal stability characterised by a retention time τ given by the Arrhenius law:

$$\tau = \tau_0 \exp\left(\frac{\Delta E}{k_B T}\right) \quad \text{[Math. 2]}$$

where ΔE is the height, or amplitude, of the energy barrier separating the two orientations 210, 220 and $\tau_0$ is the characteristic time between two switching attempts, called "test time" (or "try time"), typically of about a nanosecond. A thermal stability factor Δ is thus obtained:

$$\Delta = \frac{\Delta E}{k_B T} \quad \text{[Math 3]}$$

If it becomes non-negligible with respect to the height of the energy barrier, the thermal activation energy $k_B T$ can cause a fortuitous switching of the device, i.e. the passing of the free magnetisation 301 from one well to the other, involving a loss of the information stored within the device. The probability $\overline{P}$ of not observing a reversion due to the thermal activation after a time t is given by:

$$\overline{P} = \exp\left(\frac{-t}{\tau}\right) \quad \text{[Math. 4]}$$

In order to prevent the untimely reversion of the free magnetisation 301 and provide sustainable storage for the piece of information, the barrier height ΔE has to be adjusted. For example, a retention time τ of about 10 years corresponds to a barrier height ΔE equal to:

$$\Delta E = K_{\text{eff}} A z = k_B T \ln\left(\frac{\tau}{\tau_0}\right) \sim 40 \, k_B T \quad \text{[Math. 5]}$$

where $K_{\text{eff}}$ is the effective anisotropy coefficient of the free layer and where A and z are respectively the surface and the thickness of the free layer. At ambient temperature (about 300 K), the thermal activation energy is high, about $300 k_B$ (where $k_B$ is the Boltzmann constant).

The coupling of the iron atoms of the free layer with the oxygen or nitrogen atoms of the tunnel barrier induces an anisotropy term perpendicular to the interface, also referred to as "interface anisotropy". Heusler alloys are also of interest for obtaining an interface anisotropy. Certain Heusler alloys, comprising in particular iron such as the $Co_2FeAl$ alloy, make it possible to obtain an anisotropy perpendicular to the interface with the tunnel barrier comprising for example MgO.

The total, or effective magnetic anisotropy, of the free layer comprises the term of interface anisotropy between the free layer and the tunnel barrier. The interface anisotropy is characterised by an interface anisotropy coefficient $K_s$ expressed in energy per unit area. By way of example, for layers of CoFeB/MgO, the interface anisotropy coefficient is about $K_S \sim 1.4$ mJ/m². The magnetic anisotropy of the free layer also comprises a demagnetizing field term, resulting for example from the shape of the free layer, all the more so substantial if the latter is a thin layer. By neglecting the higher-order anisotropy terms and other possible anisotropy terms of volume of magnetocrystalline or magnetostrictive origin, the effective anisotropy coefficient $K_{\text{eff}}$ is given by:

$$K_{\text{eff}} = \frac{K_s}{z} - \frac{\mu_0 M_S^2}{2}(N_{zz} - N_{xx}) \quad \text{[Math. 6]}$$

where $\mu_o$ is the vacuum permeability, $M_s$ is the saturation magnetisation and $N_{xx}$, $N_{yy}$ and $N_{zz}$ are the components of the tensor of the demagnetizing field where $N_{xx}=N_{yy}$ (circular layer). The height of the energy barrier separating the first and second orientations 210, 220 can therefore be described by:

$$\Delta E = K_1 A z = A \left[ K_s - \frac{\mu_0 M_S^2}{2} z (N_{zz} - N_{xx}) \right] \quad \text{[Math. 7]}$$

The energy barrier disappears (ΔE=0) for a thickness z of the free layer defined by:

$$z = \frac{2 K_S}{\mu_0 M_S (N_{zz} - N_{xx})} \quad \text{[Math. 8]}$$

Consider a device comprising an interface anisotropy $K_S \sim 1.4$ mJ/m² between the free layer and the tunnel barrier and a free layer the diameter of which is much larger than the thickness ($N_{zz}-N_{xx} \sim 1$), then a critical thickness $z_c$, at which the interface anisotropy and the demagnetizing field is compensated, is 1.4 nm. When the free layer has a thickness z less than the critical thickness $z_c$, the resultant anisotropy ε is perpendicular because it is dominated by the interface anisotropy. When the free layer has a thickness z greater than the critical thickness $z_c$, for example of about 1.5 nm, the resultant anisotropy ε is planar (i.e. stable orientations belong to the reference plane) because it is dominated by the demagnetizing field. The thickness of the free layer is in an embodiment chosen less than the thickness $z_c$ in such a way that the stable orientations 210, 220 are outside the reference plane 101.

The thermal activation at very low temperature, for example 3 K, is about 100 times less than the thermal activation at ambient temperature, for example 300 K. The ratio of the thermal stability factors Δ at 3 K and 300 K is:

$$\frac{\Delta(T=300)}{\Delta(T=3)} = \frac{K_1 L}{300 k_B} \frac{3 k_B}{K_1 L} = \frac{1}{100} \quad \text{[Math. 9]}$$

The thermal stability factor Δ at 3 K is therefore one hundred times higher than the thermal stability factor at 300 K. An anisotropy ε one hundred time less at low temperature (3 K) than at 300K is therefore sufficient to obtain a retention duration of about 10 years.

According to the Arrhenius law, the retention duration r decreases when the temperature T increases. For example, a memory operating at ambient temperature has, in order to ensure a retention duration τ=10 years, an energy barrier height ΔE:

$$\Delta E(\tau=10 \text{ years})=40k_BT \qquad \text{[Math. 10]}$$

To ensure a retention duration of 1s at ambient temperature, the required barrier height becomes:

$$\Delta E(\tau=1s)=21k_BT \qquad \text{[Math. 11]}$$

A barrier of 14 $K_BT$ is sufficient for a retention duration of 1 ns and 7 $K_B$ T for a retention duration of 1 μs. This means that at ambient temperature T=300 K, an energy barrier height $$\Delta E(T=300K)=6300k_B \qquad \text{[Math. 12]}$$

is sufficient to ensure a retention duration of 1 s. And similarly, a height ΔE=2100 $k_B$ is sufficient to ensure a retention duration of 1 μs.

In other words, reducing the height ΔE of the energy barrier at ambient temperature 12,000 $k_B$ to 2,100$k_B$ reduces the retention duration τ from 10 years to 1 μs. On the other hand, reducing the energy barrier height ΔE by reducing the temperature to T=52 K makes it possible to retain a retention time τ of 10 years.

Thus the device according to the invention can be used as a non-volatile storage device operating at a temperature close to the ambient temperature and that requires only a low retention duration, of about a second or millisecond, such as static non-volatile random access memories, referred to as non-volatile SRAM memories, or FIFO (for "First In, First Out") memories or as a storage device that has a longer retention operating at cryogenic temperature.

Implementing an energy barrier of height ΔE=6300 $k_B$ at low temperature thus allows for the easy implementation of the reversion via voltage-controlled anisotropy (VCMA) with respect to barrier heights of the prior art extending from 60 $k_B$ T (which is 18,000 $k_B$ at ambient temperature) to 100 $K_BT$ (which is 30,000 $k_B$ at ambient temperature).

In addition, implementing a barrier that has a reduced height makes it possible to reduce the energy consumption during the switching phase. Non-volatile memories always have a compromise between the retention duration of the information and the facility of writing this information. A long retention duration of the information is obtained via a high barrier height ΔE because it is necessary to wait a long time for a very strong thermal fluctuation that is able to exceed the energy barrier in order to accidentally change the orientation of the magnetisation of the free layer. But this also implies that if it is voluntarily desired to change the magnetic state of the free layer during a write event, a substantial amount of energy is to be provided in order to pass the energy barrier leading to a high electrical consumption when writing. Reducing the barrier height ΔE by one or two orders of magnitude makes it possible to reduce by as much the energy to be spent to carry out the switching of the free magnetisation 301 while still retaining a high retention time, of about 10 years, at low temperature, of about from 3 K to 4 K.

Those skilled in the art can measure the height ΔE of the energy barrier in order to determine its value. For this, those skilled in the art will carry out for example a study of the change in the retention duration τ of the device according to the temperature T in such a way as to obtain the height ΔE thanks to the Arrhenius relationship:

$$\Delta E = k_BT\ln\left(\frac{\tau}{\tau_0}\right) \qquad \text{[Math. 13]}$$

Another method known to those skilled in the art to determine the barrier height consists of measuring the dependence of the switching current of the magnetisation of the free layer induced by spin transfer according to the duration of the current pulses $\tau_{pulse}$ in a so-called thermally-active regime, i.e. for current pulses having a duration $\tau_{pulse}$ typically between 20 ns to a millisecond. The current required for the magnetic switching of the soft layer then varies as $$I = I_0\left(1 - \frac{1}{\Delta}\ln\left(\frac{\tau_{pulse}}{\tau_0}\right)\right)$$

where $I_0$ is a constant corresponding to the minimum switching current required to switch at the end of an infinite time at T=0 K. The slope of the linear variation of the write current I according to ln $$\left(\frac{\tau_{pulse}}{\tau_0}\right)$$

makes it possible to determine the thermal stability factor Δ and therefore the barrier height ΔE.

Contrary to the example shown in FIGS. 4a and 4b, the anisotropy ε shown in FIG. 4c, comprises first-order and second-order anisotropy terms and can be expressed in the following way:

$$\varepsilon=K_1\sin^2(\theta)+K_2\sin^4(\theta) \qquad \text{[Math. 14]}$$

where $K_2$ is the second-order anisotropy coefficient. The resultant anisotropy is perpendicular if the following two conditions are satisfied:

$$\begin{cases} K_1 > 0 \\ K_2 > 0 \text{ or } \frac{|K_2|}{K_1} < \frac{1}{2} \end{cases} \qquad \text{[Math. 15]}$$

When $K_2<0$ and $|K_2|/K_1>\frac{1}{2}$ then the anisotropy ε is maximal when the magnetisation 301 is in the reference plane 101 or perpendicular to the reference plane 101. On the other hand, the anisotropy is minimal for an intermediate angle $\theta_c$:

$$\cos^2\theta_c = \frac{-K_1}{2K_2} \qquad \text{[Math. 16]}$$

Thus, the orientation towards which the magnetisation 301 tends to be oriented, in the absence of an external field, belongs to a cone 240, that is called easy cone, characterised by an opening angle $\theta_c$ and an axis perpendicular to the reference plane 101.

It is known in the field of magnetism that the stable orientation towards which the magnetisation tends under solely the easy cone anisotropy belongs to the wall of the easy cone, not the inside of the easy cone. "Belongs to the easy cone" thus means belonging to the wall of the easy cone.

The first and second stable orientations 210, 220 belong to the wall of the easy cone 240 and in the same way as the example shown in FIG. 4a, the components perpendicular to the reference plane 101 of the first and second orientations 210, 220 are of opposite signs.

The anisotropy ε depends on the thickness z of the free layer. As described by the equation [Math. 7], the thickness of the free layer will directly influence the first-order anisotropy term via the shape anisotropy which is a volume anisotropy therefore proportional to the thickness of the layer. As long as the thickness is less than a certain critical value such that the inequalities described by [Math. 15] are satisfied, then the magnetisation of the free layer will remain in balance perpendicular to the plane of layers. On the contrary, if the thickness of the free layer exceeds this critical value then the condition $|K_2|/K_1 > \frac{1}{2}$ becomes satisfied and then in the presence of a second-order anisotropy term $K_2 < 0$, the magnetisation of the free layer points along an easy anisotropy cone of which the opening angle is given by [Math. 16].

The second-order anisotropy term that makes it possible to carry out $K_2 < 0$ and gives rise to an easy cone anisotropy can come from the roughness at the surface of the free layer in contact with the tunnel barrier. Techniques such as ionic irradiation can be used to adapt this second-order anisotropy term and are described in more detail by [Teixeira, B. M. S.; et al, "Ion irradiation-induced easy-cone anisotropy in double-MgO free layers for perpendicular magnetic tunnel junctions", Appl. Phys. Lett. 112, 202403, 2018].

When the second-order anisotropy coefficient is negative, leading to the appearance of an easy cone anisotropy 240, the height ΔE of the energy barrier is reduced with respect to the case where the second-order anisotropy is zero.

Considering a height $\Delta E_1$ of the energy barrier due to the first-order anisotropy term (case of FIG. 4b), then the height $\Delta E_2$ of the energy barrier separating the stable orientations 210, 220, is given by:

$$\Delta E_2 = \Delta E_1 \left(1 - \frac{|K_2|}{K_1}\right) \quad [\text{Math. 17}]$$

when $|K_2|/K_1 < \frac{1}{2}$ and $$\Delta E_2 = \frac{\Delta E_1 K_1}{4|K_2|} \quad [\text{Math. 18}]$$

when $|K_2|/K_1 > \frac{1}{2}$. Thus, when the anisotropy ε has an easy cone 240, the effective height of the energy barrier is reduced, facilitating the switching of the free magnetisation 301 and reducing the energy consumption required for said switching. In addition, the existence of an initial angle between the normal to the plane of the layers and the direction of the magnetisation makes it possible to reduce the stochasticity of the switching during the writing of the magnetic state of the free layer.

On the other hand, when the anisotropy ε is of the easy cone anisotropy 240 type, the tunnel magnetoresistance signal that can be obtained is slightly reduced. Indeed, the free magnetisation 301 is then slightly inclined with respect to the reference magnetisation. However, the reduction in the amplitude of the tunnel magnetoresistance signal is according to the cosine of the relative angle between these two magnetisations. Thus, if the easy cone 240 has a moderate opening, for example, θ<45°, then the reduction in amplitude of the tunnel magnetoresistance signal remains low. For example, when the easy cone 240 has an opening angle of θ=20°, the amplitude of the magnetoresistance signal is reduced from 200% to 177%, which is a reduction of 12% in relative value (i.e. (200%-177%)/200%).

FIG. 5 diagrammatically shows the effect of the application of a voltage V(t) through the tunnel barrier. When an electrical voltage is applied through the tunnel barrier, the electric field produced modifies the interface anisotropy that exists between the free layer and the tunnel barrier by a quantity $\Delta K_s(V)$ that has for effect to modify the total anisotropy of the free layer. This effect is called controlling the magnetic anisotropy via a voltage or VCMA for "Voltage-Controlled Magnetic Anisotropy". VCMA makes it possible to reduce the height of the energy barrier separating the wells associated with the stable orientations. Thus thanks to the VCMA, the free magnetisation can pass from one well to the other, implying the switching of said magnetisation.

The influence of the electric field on the first-order anisotropy term of the interface anisotropy is generally higher than on the higher-order anisotropy terms. For reasons of simplicity, we shall provide details on the action of the VCMA only on the first-order anisotropy term of the interface anisotropy. However, the conclusions remain unchanged even taking account of higher-order anisotropy terms.

The variation $\Delta K_S(V)$ in the interface anisotropy can be positive or negative according to the polarity of the electrical voltage V applied. The writing of a magnetisation state within the magnetic device is therefore carried out via a voltage pulse of which the polarity is configured to reduce the height of the anisotropy barrier. The height ΔE of the energy barrier according to the variation $\Delta K_S$ in the interface anisotropy is therefore expressed as:

$$\Delta E(V) = K_{eff}(V) z A \quad [\text{Math. 19}]$$

where $K_{eff}(V)$ is the effective first-order anisotropy coefficient, as a function of electrical voltage V, where A is the surface of the free layer and z is the thickness of the free layer. Thus:

$$\Delta E(V) = A\left[K_s + \Delta K_s(V) - \frac{\mu_0 M_S^2}{2} z(N_{zz} - N_{xx})\right] \quad [\text{Math. 20}]$$
$$= A(K_{eff}(V=0)z + \Delta K_s(V))$$

where $K_s$ is the interface anisotropy coefficient. The coefficient β of VCMA is defined as the ratio between the variation $\Delta K_S(V)$ of the interface anisotropy by the electric field through the tunnel barrier, or V/w where w is the thickness of the tunnel barrier 120. Thus the coefficient β of VCMA is expressed as:

$$\beta = \frac{\Delta K_s(V) w}{V} \quad [\text{Math. 21}]$$

of unit fJ/V/m. Experimentally, the coefficient β is typically comprised between 30 fJ/V/m and 150 fJ/V/m for interfaces between FeCoB and MgO alloys.

The application of an electrical voltage of 1V through the tunnel barrier of a memory according to the prior art, having a high energy barrier height (e.g.: retention of 10 years at ambient temperature) involves an interface anisotropy variation $\Delta K_S$ of about 10% with respect to the situation where the applied voltage is zero. Thus, the VCMA is too low itself to allow for the switching of the free magnetisation in a memory of the prior art.

On the other hand, the device according to the invention is characterised by a reduced barrier height $\Delta E$. Thus, the interface anisotropy variation $\Delta K_S$ becomes substantial with respect to this reduced barrier height, making it possible to reduce the barrier height by at least 50%, even induce the disappearance of the easy axis 230 or of the easy cone 240 and the creation of an easy plane corresponding to the reference plane. The latter case contributes very favourably to the magnetisation reversion of the free layer.

The measurement of the orientation of the magnetisation of the free layer is carried out in an embodiment through the measurement of a tunnel magnetoresistance signal. Measuring the tunnel magnetoresistance signal implements the flow of an electrical current within the device. In order to reduce the risk of magnetisation reversion, the polarity of the electrical voltage V applied through the tunnel barrier is beneficially opposite the polarity of the electrical voltage V applied through the tunnel barrier in order to carry out the switching of the free magnetisation. Thus the interface anisotropy is increased, reducing the probability of magnetisation reversion. The opening of the easy cone is also reduced by the application of this read voltage, making it possible to increase the amplitude of the tunnel magnetoresistance signal.

In order to facilitate the reversion of the free magnetisation, the free layer beneficially has a high VCMA coefficient at the interface with an oxide (and/or nitride) layer. The VCMA coefficient values sought are potentially greater than 30 fJ/V/m and in an embodiment greater than 1.00 f/V/m. To achieve this, the free layer can be carried out from a Co and Fe alloy. Heusler alloys such as $Co_2MnSi$, $Co_2Mn_{1.29}Al$, $Co_2FeAl_{0.5}Si_{0.5}$, $Co_2FeAl$, $Co_2Cr_{0.6}Fe_{0.4}Al$ or $Co_2Fe_{0.4}Mn_{0.6}Si$ also make it possible to obtain high VCMA coefficients.

The free layer is beneficially subjected to a planar magnetic field, substantially aligned according to the reference plane. The term "substantially aligned", means aligned to ±20°. Various ways of applying a magnetic field on a free layer have already been proposed in the context of magnetic memories of the MRAM type implementing spin-orbit coupling (called SOT-MRAM for "spin orbit transfer magnetic random access memory") and for which the same planar magnetic field requirement exists. The planar magnetic field can come from an external source such as a permanent magnet or a frozen magnetic field, disposed in the vicinity of the device and radiating a static magnetic field in the reference plane. These are the least costly solutions in terms of energy consumption.

According to an alternative, the anisotropy $\varepsilon$ of the free layer comprises a second first-order anisotropy term, oriented in the reference plane and which is added to the first first-order anisotropy term, oriented outside the reference plane.

A first way to achieve this comprises the carrying out of the free layer in such a way that it has an elliptic shape in the reference plane. The elliptic shape induces a demagnetizing field along the large axis of said ellipse which is added to the anisotropy $\varepsilon$ of the free layer. However, an aspect ratio of the ellipse will be chosen comprised between 1.2 and 3 in such a way that the effective anisotropy $\varepsilon$ remains outside the reference plane. The adding of a demagnetizing field in the reference plane breaks the rotation symmetry of the magnetisation around the normal to the reference plane. The anisotropy field of associated shape plays the role of the planar field required for the magnetic switching of the free layer via VCMA.

A second way to achieve this comprises the treatment of the free layer in such a way as to create a particular crystallographic arrangement of the material belonging to said resultant layer in a second uniaxial anisotropy term oriented in the reference plane. An annealing of the free layer is for example carried out under a strong magnetic field, for example of about 1 T, belonging to the reference plane. Within alloys of the FeCo or NiFe type or more generally with an Iron Fe, Cobalt Co or Nickel NI base, an arrangement at the atomic scale is produced during the annealing under magnetic field inducing the second uniaxial anisotropy term along the direction of application of the strong magnetic. This phenomenon is called "pair anisotropy", It corresponds to a particular arrangement at the atomic scale of the atoms of two different species (for example Ni and Fe) during the annealing under a strong field.

A third way of achieving this comprises the implementation of the magnetostriction of certain magnetic materials resulting from the application of a mechanical deformation. For example, some $Co_xFe_yB_{1-x-z}$ alloys are characterised by a strong magnetostriction that makes it possible to generate the second uniaxial anisotropy term in the plane.

Finally, a fourth way of achieving this is shown in FIG. 3. The second uniaxial anisotropy term comes from an exchange coupling with a sixth antiferromagnetic layer 170, for example made from IrMn, in contact with the free layer 110, creating an exchange anisotropy (or "exchange bias") in the reference plane 101. Those skilled in the art know that such an exchange anisotropy appears after having annealed the whole above the blocking temperature of the sixth antiferromagnetic layer 170 and after having allowed it to cool to ambient temperature in a magnetic field oriented in the reference plane 101, said magnetic field being sufficiently substantial to saturate the magnetisation of the free layer 110 during the cooling in the reference plane 101.

The free layer has a damping factor, also called Gilbert factor, that it is desirable to choose between 0.02 and 0.4. The damping factor takes account of the dissipation of the energy of the magnetisation of the free layer when the latter is set into motion.

To adjust the Gilbert factor, impurities that have a high spin-orbit coupling are added to the alloy that forms the free layer. This can be rare earths such as: Dysprosium Dy, Terbium Tb or heavy metals such as: Platinum Pt, Gold Au, Tungsten W, Tantalum Ta or Iridium Ir or a combination of these seven elements. These elements can be incorporated into the free layer or be deposited on the latter, forming a fine dusting layer. So as to not reduce the amplitude of the tunnel magnetoresistance or the interface anisotropy, the dusting layer is in an embodiment deposited on a first face of the free layer 110, opposite a second face of the free layer 110 in contact with the tunnel barrier 120. The dusting layer can be deposited between the free layer 110 and the sixth antiferromagnetic layer 170. However, the thickness of the dusting layer is configured to retain the exchange coupling between the sixth antiferromagnetic layer 170 and the free layer 110.

According to an embodiment, the free layer and the reference layer comprise a $LaSrMnO_3$ alloy and the tunnel barrier comprises a $SrTiO_3$ alloy. The magnetic tunnel junction thus formed is of the LaSrMnO$_3$/SrTiO$_3$/LaSrMnO$_3$ type, semi-metallic and has a tunnel magnetoresistance at very low temperature, of about 1800% at 4 K.

FIGS. 7 and 8 show results of a digital simulation of the device according to the invention according to parameter of the voltage pulse and of the temperature.

The digital model 600 corresponding to the device according to the invention is shown in FIG. 6. The discussions, results and conclusions that are obtained for the digital model 600 can be transposed to the magnetic device according to the invention.

The digital model 600 describes the movement of the free magnetisation 601 by a macrospin that obeys the Landau-Lifshitz-Gilbert-Slonczewski law. The thermal fluctuations are modelled by a random magnetic field. The model in particular comprises:
- a free layer 610, extending along a reference plane and comprising a free magnetisation 601;
- a planar magnetic field 603, applied on the free layer 610 in the reference plane;
- a magnetic anisotropy comprising first-order and second-order anisotropy terms, inducing an easy cone anisotropy the axis of which is perpendicular to the reference plane;
- an energy barrier, separating a first orientation and a second orientation, having a height of 3000 k$_B$;
- a Gilbert factor equal to 0.1;
- a reference layer 640 having a reference magnetisation 602, frozen perpendicularly to the reference plane; and
- a tunnel barrier 620 separating the free layer 610 and a reference layer 640.

The table hereinbelow recalls the characteristics implemented in the model.

TABLE 2

| | |
|---|---|
| Dimensions | 30 nm × 30 nm × 2 nm |
| N$_{xx}$, N$_{yy}$ | 0.0733 |
| N$_{zz}$ | 0.853 |
| K$_1$ | 0.420 × 10$^6$ J/m$^3$ |
| K$_1^{eff}$ | 0.023 × 10$^6$ J/m$^3$ |
| K$_2$ | −0.023 × 10$^6$ J/m$^3$ |
| M$_s$ | 0.9 × 10$^6$ A/m |
| β | −300 fJ/V/m |
| α | 0.1 |
| H$_0$ | 10 mT |
| TMR | 100% |
| R$_p$ | 300 kΩ |

FIG. 7 has two mappings of the probability of switching P according to the amplitude A and the duration d of the voltage pulse applied on the tunnel barrier. The polarity of the electrical voltage pulse applied is configured to reduce the interface anisotropy.

The thermal stability at 4 K and at ambient temperature is identical and set to Δ=50, the height of the energy barrier being adjusted for each temperature. Each pixel of the figures of FIG. 7 is simulated 50 times in order to obtain a probability P of switching the free magnetisation.

In the first graph, corresponding to 4 K, the alternation of zones corresponding to a switching probability P>>0 and P<<1 indicates that the switching of the free magnetisation is carried out via coherent precessional reversion, with a strong coherency due to the weakness of the thermal fluctuations. This alternation of zones (P>>0 and P<<1) is not observed on the second graph because the thermal fluctuations at 300 K are too substantial.

The most striking difference between the two results corresponds to the minimum amplitude A of the electrical voltage for which a non-zero switching probability P is observed. At 4 K, the barrier height being reduced, a lesser amplitude A is required to allow for the switching. Additional simulations furthermore make it possible to show that the switching at T=4 K is always observed even for a planar magnetic field 11 less than 10 mT or an electrical pulse amplitude A of a few tens of millivolts only.

The precessional reversion of the magnetisation according to the prior art is difficult to implement because it requires a very precise control of the current pulse parameters implemented. It is possible to implement it for an individual memory element; on the other hand, it is more difficult, even impossible, to control the precessional reversion of thousands of memory elements on the scale of a memory chip, in particular due to the deformation of the pulse propagating along electrical conductors inside the chip. A better tolerance interval of the parameters of the voltage pulse is obtained thanks to the device according to the invention.

FIG. 8 shows a mapping of the switching probability P of the free magnetisation according to the amplitude A and the duration d of the voltage pulse. Contrary to the mappings of FIG. 7, the simulation is carried out at zero temperature, i.e. without thermal fluctuations. However a barrier height of 3000 k$_B$ is considered.

Three characteristics can be observed: switching loops in a first region 8-A, cut-off bands in a second region 8-B and switching bands in a third region 8-C.

The switching loops and the cut-off bands are very sensitive to thermal fluctuations. FIG. 9 shows for example, a mapping of the switching probability for a temperature of 4 K, where the absence of switching loops and cut-off bands can be noted. It is therefore difficult to draw a benefit from these operating points to carry out the switching of the free magnetisation in an applied framework.

On the other hand, the switching bands (third region 8-C) show good robustness to the thermal fluctuations at 4 K (observable in FIG. 9). The switching bands are therefore of interest in carrying out the writing of a piece of information on the magnetic device by VCMA.

In the absence of an external magnetic field applied perpendicularly to the reference plane, the results of the simulations are identical whether concerning a reversion from the first orientation to the second orientation or from the second orientation to the first orientation.

However, in the framework of a real device, such an external perpendicular field could exist due to the field radiated by the reference layer. It is however known to those skilled in the art that this radiated field can however be limited by the implementation of a reference layer of the synthetic antiferromagnetic type. If however an external magnetic field is applied, it modifies the reversion mappings but not the types of structures that can be observed, such as the switching bands.

The switching bands are interesting from an application standpoint because by choosing an operating point with said switching bands, it is possible to control the magnetisation reversion of the free layer with a reversion probability of 100% obtained with a very high tolerance on the duration of the pulses around the operating point.

As soon as a minimum amplitude A$_c$ and a minimum duration d$_c$, called critical amplitude and duration, are reached, the reversion probability is constant, regardless of the duration d>d$_c$ of the voltage pulse. Contrary to the results shown in the prior art, the duration d of the voltage pulse offers a large tolerance interval in order to successfully carry out the reversion of the first magnetisation.

For example, FIG. 10 shows the temporal variation of the magnetisation according to the normal to the reference plane $M_z$ for different pulse durations $d_1$, $d_2$, $d_3$, $d_4$, $d_5$ extending from 1 ns and 5 ns. In this figure, the voltage pulse begins at instant t=10 ns and ends at instant t=10 ns+$d_i$, with $d_i$ representing the pulse durations $d_1$, $d_2$, $d_3$, $d_4$, $d_5$. In FIG. 10, only the variation V(t) for the pulse of 5 ns is shown. Thus, regardless of the duration d of the voltage pulse, the free magnetisation switches to the opposite state and converges towards the new stable orientation, without bouncing to return to the initial orientation.

FIGS. 11a and 11b diagrammatically show a first trajectory 11-1 and a second trajectory 11-2 sequentially followed by the free magnetisation during the switching, implementing the effect of the VCMA. The trajectories materialise the displacement of the point of the free magnetisation on a unit sphere. The colour code on the surface of these spheres represents the total magnetic energy of the free layer, i.e., the energy landscape wherein the free magnetisation changes.

The energy landscape of FIG. 11a shows a first well P1 and a second well P2 separated by an energy barrier. The first well P1 corresponds to the first stable orientation and the second well P2 corresponds to the second orientation. The energy represented corresponds to the sum of an easy cone anisotropy that has a cone axis perpendicular to the reference plane plus the Zeeman energy associated with the coupling of the magnetisation of the free layer to a planar magnetic field. Thus, due to the application of the planar field, the stable orientations are slightly deviated from the normal to the reference plane and the two wells P1, P2 are close together on one side of the sphere. The energy barrier thus has a saddle point B1 that corresponds to the minimum energy barrier that must be crossed in order to pass from one well to the other, for example from P1 to P2.

FIG. 11b shows the deformation of the energy landscape when an electrical voltage is applied to the terminals of the tunnel barrier. The polarity of the pulse is configured to reduce the height of the energy barrier, lowering the saddle point B1. The two wells P1', P2' have also come close to the saddle point B1.

The reversion of the free magnetisation by VCMA takes place in three steps. In a first step the system is idle and the total energy of the free layer is shown in FIG. 11a. The magnetisation is at the bottom of the first well P1, in a first orientation M1.

When the voltage pulse is applied to the magnetic device, and during their entire duration of the magnetic pulse, the magnetic anisotropy is modified which modifies the total energy, shown in FIG. 11b. The free magnetisation, which is at point M1 is no longer at the level of the lowest energy and initiates a precession movement. In the absence of damping, the precession is carried out at constant energy and follows the iso-energy curves of the energy landscape. The damping, characterised by the Gilbert factor, dissipates a quantity of power that has for effect to deform the trajectory associated with the precession of the magnetisation in such a way that it converges towards a local energy minimum. In the example of FIG. 11b, the magnetisation followed the first trajectory 11-1 and converged in the second well P2', in a second orientation M2'. At this stage, the system is stable and the magnetisation will occupy the second well P2' as long as the electrical voltage is maintained at the terminals of the tunnel barrier.

Finally, the application of the electrical voltage is interrupted and the energy landscape returns to its initial shape, shown in FIG. 11a. The magnetisation, occupying the orientation M2' is no longer at the level of the lowest energy and initiates a new precession movement, along the second trajectory 11-2, which makes it converge to the bottom of the second well P2, according to the orientation M2. The orientation M2' has an energy less than the saddle point B1, stepping back when the electrical voltage is cut off is therefore not possible.

When the voltage is applied, the magnetisation converges towards the orientation M2 thanks, on the one hand, to the precession movement triggered by the lowering of the anisotropy at the moment when the voltage pulse is applied and on the other hand, to the damping. The Gilbert factor considered in this simulation is equal to 0.1 and is high enough for the magnetisation to be able to join the bottom of the second well P2' before the stopping of the application of the electrical voltage at the terminals of the tunnel barrier without being too high for the energy communicated to the magnetisation of the soft layer by the lowering of the magnetic anisotropy to be entirely dissipated before the magnetisation has succeeded in passing the energy barrier separating the two wells P1, P2'.

In the discussion hereinabove, it was shown that the magnetisation reversion can be obtained with a large tolerance interval over the duration of the pulse, when the critical amplitude $A_c$ is reached. However, it can also be difficult to precisely control the amplitude of the voltage pulse, in particular along the conductive lines of an electronic chip. The electrical pulses tend to widen as they propagate, correlatively reducing their amplitudes in a manner that is difficult to control.

The invention makes it possible to implement a voltage pulse according to an operating point making it possible to obtain a tolerance interval that is sufficient for both the amplitude and the duration of the pulse.

FIG. 12 shows a simulation result of the reversion probability of the first magnetisation according to the amplitude A and the duration d of the voltage pulse. FIG. 12 shows in particular a first region R1, of rectangular shape and a second region R2, of circular shape. These regions correspond to a set of operating points (A, d) of the voltage pulse, that can be considered for implementation.

The first region R1 corresponds to a switching band, such as shown in FIG. 8, for which a first tolerance interval ID1 of the duration is very large. It is however observed that a second tolerance interval IA1 of the amplitude does not exceed 50 mV. Beyond the second tolerance interval, the probability of switching decreases substantially.

The second region R2 occupies a disc within the same switching band as the first region R1. Within the second region, a third tolerance interval id2 of the duration of the pulse is less than the first tolerance interval id1. On the other hand, a fourth tolerance interval IA2 on the amplitude of the pulse is greater than the second tolerance interval IA1. Thus, the magnetic device can have both a first and a second region R1, R2. The choice of the operating point to be considered obviously depends on the field of application of the device and on the operating conditions. The benefit of the region R1 is to offer a large tolerance on the duration of the pulse but a low tolerance on the amplitude of the pulse while the region R2 offers a good compromise in tolerance both on the duration and the amplitude of the voltage pulse.

The second tolerance interval IA1 on the amplitude A of the pulse can be increased by decreasing the intensity of the planar magnetic field applied on the free magnetisation. Indeed, a field of 2 mT makes it possible to obtain a second tolerance interval IA1 of about 50 mV while a field of 10 mT reduces it drastically. However, the reduction in the planar magnetic field also reduces the reliability of the switching of the free layer of the device during a write event in the presence of thermal fluctuations.

On the other hand, the fourth tolerance interval IA2 on the amplitude A of the pulse shows good robustness regardless of the planar magnetic field applied. Thus, a magnetic device according to the invention, intended to be implemented with a voltage pulse of which the operating point is located in the second region R2, is more robust to the thermal fluctuations and to manufacturing variations.

For example, the simulation result shown in FIG. 12 is carried out for a temperature of 4 K. The thermal fluctuations have a lower impact in the vicinity of the second region R2 than in the vicinity of the first region R1. Thus, the fourth tolerance interval IA2 is reduced by about 15% between 0 K and 4 K while the second tolerance interval IA1 is reduced by about 70%.

Instead of applying a planar magnetic field, the reversion via VCMA can beneficially benefit from a first-order anisotropy term (uniaxial) belonging to the reference plane and added to the effective magnetic anisotropy of the device. In order to obtain a uniaxial anisotropy term in the reference plane, the free layer can have the shape of an ellipse in the reference plane. However, replacing the application of a magnetic field with a uniaxial anisotropy in the reference plane modifies the precession dynamics of the magnetisation, in particular due to the bidirectional aspect of the uniaxial anisotropy term.

FIGS. 13a and 13b show results of digital simulations according to an aspect ratio $\alpha$ of the free layer. The aspect ratio corresponds to the ratio of the length of the large axis with respect to the length of the small axis of the ellipse.

FIG. 13a shows the change in the critical amplitude $A_c$ according to the aspect ratio $\alpha$. The critical amplitude $A_c$ corresponds to the amplitude required to carry out the reversion of the free magnetisation. The critical amplitude $A_c$ to carry out the reversion is minimal around an aspect ratio $\alpha$ of about 2.5.

FIG. 13b shows the change in the tolerance interval $\Delta A$ on the amplitude of the pulse according to the aspect ratio $\alpha$. The tolerance interval $\Delta A$ increases starting from an aspect ratio $\alpha$ of 2.

FIGS. 14a and 14b show the expense of the critical amplitude $A_c$ and the tolerance interval $\Delta A$ around this critical amplitude according to the Gilbert factor $\alpha$. The simulated device comprises in particular the shape of an ellipse in the reference plane and an aspect ratio of 1.5. The duration of the voltage pulse considered is 3 ns.

The critical amplitude $A_c$ increases linearly with the Gilbert factor $\alpha$, however the slope is low. For example, the critical amplitude $A_c$ increases 35% when the Gilbert factor $\alpha$ increases by a factor of 5.

The variation in the tolerance interval $\Delta A$ according to the Gilbert factor $\alpha$ is more pronounced and shows a maximum around $\alpha=0.1$ This indicates that the Gilbert factor $\alpha$ should be chosen in an interval comprised between 0.02 and 0.4.

In order to improve the robustness of the reversion while still reducing the amplitude A of the voltage pulse, it is desirable to consider a large tolerance interval $\Delta A$. For this, the Gilbert factor $\alpha$ should be chosen in an interval comprised between 0.05 and 0.3 and for example between 0.1 and 0.3.

The critical amplitude $A_c$ can be estimated theoretically according to the different parameters of the device, such as the material parameters, Considering that the reversion intervenes when the energy of the free magnetisation is equal to the energy of the apex of the barrier that separates the two stable orientations, then the energy density $\epsilon$ is given by:

$$\epsilon(\theta,\varphi)=-K_{\mathit{eff}}(V)\cos\theta^2-K_2\cos\theta^4-\mu_o M_S H\sin\theta\cos\varphi \quad \text{[Math. 19]}$$

where $\theta$ is the angle of the magnetisation with the normal to the reference plane and $\varphi$ is the angle of the projection of the magnetisation in the reference plane with the large axis of the free layer. In the presence of a planar magnetic field H, aligned with the large axis of the free layer (or simply in the reference plane if the latter is circular), the magnetisation is deviated towards the reference plane by an angle $\theta_0$. The state of equilibrium minimises the energy density $\epsilon$ according to:

$$\begin{cases} \dfrac{\partial}{\partial\theta}\epsilon(\theta_0,\varphi=0°)\Big|_{A=0}=0 \\ (\sin\theta_0)^3-\left(1+\dfrac{K_{\mathit{eff}}}{2K_2}\right)\sin\theta_0+\dfrac{\mu_o M_S H}{4K_2}=0 \end{cases} \quad \text{[Math. 20]}$$

Thus, the critical amplitude $A_c$ to obtain the reversion is given by:

$$-(K_{\mathit{eff}}+\beta A_c)\cos\theta_0^2-K_2\cos\theta_0^4-\mu_o M_S H\sin\theta_o=-\mu_o M_S H \quad \text{[Math. 21]}$$

$$A_c=\frac{1}{\beta}\left[\frac{\mu_o M_S H(1-\sin\theta_0)}{\cos\theta_0^2}-K_2\cos\theta_0^2-K_{\mathit{eff}}\right] \quad \text{[Math. 22]}$$

FIGS. 15a to 15e show the influence of several parameters on the switching of the magnetisation by VCMA, in particular the influence on the critical amplitude $A_c$ from which the reversion becomes possible as well as the tolerance interval $\Delta A$ around the critical amplitude $A_c$.

The results of FIGS. 15a to 15e are obtained by simulation of the magnetic device by considering the properties of table 3 and a Gilbert factor $\alpha=0.2$. They are also obtained using analytical expressions such as detailed hereinabove by considering a Gilbert factor $\alpha=0.0$. The trends shown in FIGS. 15a to 15e thus provide a support in order to dimension the properties of the magnetic device.

TABLE 3

| Dimensions | 30 nm × 30 nm × 2 nm |
|---|---|
| $N_{xx}$, $N_{yy}$ | 0.0733 |
| $N_{zz}$ | 0.0853 |
| $K_1$ | 0.500 × 10$^6$ J/m$^3$ |
| $K_1^{\mathit{eff}}$ | 0.038 × 10$^6$ J/m$^3$ |
| $K_2$ | −0.057 × 10$^6$ J/m$^3$ |
| $M_s$ | 0.95 × 10$^6$ A/m |
| $\beta$ | −300 fJ/V/m |
| H | 20 mT |

The aforementioned figures show the variation in critical amplitude $A_c$ and in tolerance interval $\Delta A$ according to the saturation magnetisation $M_s$ for FIG. 15a, of the planar magnetic field H for FIG. 15b, of the first-order anisotropy coefficient $K_1$ for FIG. 15c and of the second-order anisotropy coefficient $K_2$ for FIG. 15d.

The jump in the tolerance interval $\Delta A$ that can be observed in FIG. 15a corresponds to the merger of two switching bands. However this particular regime seems difficult to implement practically because it is very sensitive to the thermal fluctuations, even at low temperature (4 K in this example).

The critical amplitude $A_c$ decreases for negative values of the second-order anisotropy coefficient $K_2$, less in absolute value than $0.3 \cdot 10^5$ J/m³, and tends towards an asymptotic value as $K_2$ increases in absolute value. The tolerance interval $\Delta A$ reaches a plateau when the second-order anisotropy coefficient $K_2$ exceeds in absolute value $10^5$ J/m³, confirming the improvement in the reversion via VCMA when the stable orientations are based on an easy cone anisotropy.

FIG. 15e shows the variation in the tolerance interval $\Delta A$ according to the Gilbert factor for a pulse duration of 1.0 ns (curve 15-1) and 1.9 ns (curve 15-2). These two curves correspond to the two sections 8-1, 8-2 materialised in FIG. 8. The tolerance interval $\Delta A$ varies linearly with the Gilbert factor, showing an improvement in the reproducibility of the reversion via VCMA when the Gilbert damping inside the interval considered is increased.

FIG. 16 shows the change in the critical amplitude $A_c$ according to the VCMA coefficient β. It is interesting to note that the effect of the coefficient β on the critical amplitude $A_c$ decreases as the coefficient β increases in absolute value. Thus, moderate values of coefficients β, such as those obtained at the interface between a free layer made from CoFeB and a tunnel barrier made from MgO, are sufficient to carry out a device the reversion of which is carried out by VCMA.

The reading of the state of the device 100 is carried out by measuring the resistance of the device. For this, an electrical current flows through the device and the variation in resistance, according to the tunnel magnetoresistance, makes it possible to determine the relative orientation of the free magnetisation in relation to the fixed magnetisation.

In order to facilitate the reading of the state inscribed within the device, the magnetic tunnel junction in an embodiment has a high magnetoresistance. The tunnel magnetoresistance ratio of a magnetic tunnel junction comprising a tunnel barrier made of MgO is in the state of the art comprised between 200% and 600% at ambient temperature according to the composition of the magnetic electrodes and the annealing temperature used after the deposition of the layers. This tunnel magnetoresistance increases at low temperature and can double when passing from 300K to 4K. A high magnetoresistance makes it possible to rapidly differentiate the state of low and high resistance, offering increased read speed.

The tunnel barrier can comprise a single layer of oxide or a single layer of nitride or a stack of the aforementioned single layers. However, the tunnel barrier is characterised by a product of its resistance by its surface referred to as "RA" product. Its unit is $\Omega \cdot \mu m^2$. The composition and the thickness of the tunnel barrier are configured so as to provide a RA product greater than or equal to $10\Omega \cdot \mu m^2$ and in an embodiment greater than or equal to $100\Omega \cdot \mu m^2$. In this way, the electrical current density flowing within the device during the write phase is limited and thus makes it possible to reduce the electrical consumption of said device. In order to further reduce the electrical consumption, the RA product can be greater than or equal to $1000\Omega \cdot \mu m^2$. On the other hand, such values of the RA product can excessively reduce the read speed of the state of the device because they lead to a substantial drop in the read current passing through the junction.

During the reading of the state of the device 100, the voltage at the terminals of the tunnel barrier should not be excessively high, as the amplitude of the tunnel magnetoresistance decreases with the voltage. However a low read current implies a larger read time. Thus, a read voltage will beneficially be chosen comprised between 0.15 V and 0.4 V. By way of example, the device having a diameter of 50 nm, a tunnel barrier characterised by a RA product of $100\Omega \cdot \mu m^2$ (the resistance of the tunnel barrier being preponderant with respect to the other contributions), has a total resistance of about 51 kΩ. The electrical current flowing in the device to which an electrical voltage of 0.4 V is applied is about 7 μA. The minimum read time is approximately a nanosecond. If the tunnel barrier has a surface resistance of $1000\Omega \cdot \mu m^2$ then the electrical current flowing in the device to which an electrical voltage of 0.4 V is applied is about 0.7 μA. The minimum read time is approximately about ten nanoseconds. The duration of application of the read electrical current is significantly longer than the duration of the voltage pulse for the write.

Beneficially, the polarity of the read voltage, in other words the sign of the read voltage, is chosen opposite the polarity of the write voltage, i.e. to the sign of the write voltage. In this way, the component perpendicular to the reference plane of the magnetic anisotropy of the free layer is reinforced by the read voltage although it was decreased by the write voltage.

The invention claimed is:

1. A voltage-controlled cryogenic magnetic device, comprising:
   a first magnetic layer, forming a free layer, extending along a reference plane and having a first magnetisation, forming a free magnetisation, and a magnetic anisotropy favouring the orientation of the free magnetisation according to a first orientation or a second orientation, the first orientation comprising a first component perpendicular to the reference plane and the second orientation comprising a second component perpendicular to the reference plane, the first perpendicular component and the second perpendicular component being of opposite signs, the magnetic anisotropy being defined by an energy barrier separating the first orientation and the second orientation, an amplitude of the energy barrier being less than 6300 $k_B$ at cryogenic temperature, the free layer having a Gilbert damping factor comprised between 0.02 and 0.4;
   a second non-magnetic insulating layer, forming a tunnel barrier, extending in contact with the free layer; and
   a system configured to apply a voltage pulse through the tunnel barrier, said voltage pulse being suitable for reducing the amplitude of the energy barrier and switching the free magnetisation from:
   the first orientation to the second orientation; or from
   the second orientation to the first orientation.

2. The device according to claim 1, wherein said system is configured to control the magnetic anisotropy of the free layer by a voltage applied by the voltage-controlled magnetic anisotropy effect referred to as VCMA effect.

3. The device according to claim 1, comprising a third magnetic and conductive layer, forming a reference layer, extending in contact with the tunnel barrier and having a second magnetisation, forming a reference magnetisation, fixed and substantially perpendicular to the reference plane, the reference layer being able to transmit the voltage pulses to the tunnel barrier.

4. The device according to claim 1, wherein the Gilbert damping factor of the free layer is comprised between 0.05 and 0.3.

5. The device according to claim 1, wherein the free layer has a first thickness chosen so that the amplitude of the energy barrier is less than 6300 $K_B$.

6. The device according to claim 1, wherein the free layer has a magnetic anisotropy such that the first orientation and the second orientation belong to:
- an easy axis, substantially perpendicular to the reference plane; or
- an easy cone, the axis of the easy cone being substantially perpendicular to the reference plane.

7. The device according to claim 1, comprising a system configured to apply a planar magnetic field at the free layer, at least during the duration of application of the voltage pulse, said planar magnetic field being substantially contained inside the reference plane.

8. The device according to claim 1, comprising an antiferromagnetic layer configured to apply an exchange anisotropy at the free layer.

9. The device according to claim 1, wherein the free layer has a magnetic anisotropy comprising a uniaxial component substantially contained inside the reference plane.

10. The device according to claim 9, wherein the free layer has a crystallographic structure configured to induce the uniaxial anisotropy component substantially contained in the reference plane.

11. The device according to claim 9, wherein the free layer has the shape of an ellipse in the reference plane, an aspect ratio of the ellipse being comprised between 1.2 and 3.

12. The device according to claim 1, wherein the tunnel barrier is chosen such that the product of its resistance by its surface is greater than $10\Omega \cdot \mu m^2$.

13. The device according to claim 1, wherein the free layer comprises an Iron-based alloy and an amorphising element.

14. The device according to claim 1, wherein the free layer comprises impurities that have a high spin-orbit coupling.

15. The device according to claim 1, wherein the free layer comprises a first face, in contact with the tunnel barrier and a second face, opposite the first face, in contact with a dusting layer able to produce an increase in the Gilbert damping factor, said dusting layer comprising impurities that have a high spin-orbit coupling.

16. The device according to claim 1, wherein the voltage pulse comprises:
- a first polarity configured to reduce the amplitude of the energy barrier, of duration and amplitude chosen to switch the free magnetisation; and
- a second polarity opposite the first polarity and configured to increase the amplitude of the energy barrier, of duration and amplitude chosen to allow for the reading of the magnetic state of the free layer.

* * * * *